United States Patent [19]

Tokuda et al.

[11] Patent Number: 4,817,110

[45] Date of Patent: Mar. 28, 1989

[54] SEMICONDUCTOR LASER DEVICE

[75] Inventors: Yasunori Tokuda; Kenzo Fujiwara; Noriaki Tsukada; Keisuke Kojima; Yoshinori Nomura; Teruhito Matsui, all of Amagasaki, Japan

[73] Assignee: Mitsubishi Denki Kabushiki Kaisha, Tokyo, Japan

[21] Appl. No.: 78,393

[22] Filed: Jul. 24, 1987

[30] Foreign Application Priority Data

| Jul. 25, 1986 | [JP] | Japan | 61-175965 |
| Jul. 25, 1986 | [JP] | Japan | 61-175966 |
| Jul. 25, 1986 | [JP] | Japan | 61-175967 |
| Jul. 25, 1986 | [JP] | Japan | 61-175968 |
| Jul. 25, 1986 | [JP] | Japan | 61-175969 |
| Jul. 25, 1986 | [JP] | Japan | 61-175970 |
| Jul. 25, 1986 | [JP] | Japan | 61-175971 |
| Jul. 25, 1986 | [JP] | Japan | 61-175972 |
| Jul. 25, 1986 | [JP] | Japan | 61-175973 |
| Jul. 25, 1986 | [JP] | Japan | 61-175974 |
| Jul. 25, 1986 | [JP] | Japan | 61-175975 |
| Jul. 26, 1986 | [JP] | Japan | 61-176287 |

[51] Int. Cl.$^4$ ............................. H01S 3/19
[52] U.S. Cl. ........................ 372/45; 372/44; 372/46; 372/47; 372/49; 372/50
[58] Field of Search .................. 372/43–47, 372/49, 50

[56] References Cited

U.S. PATENT DOCUMENTS

| 4,326,176 | 4/1982 | Aiki et al. | 372/46 |
| 4,329,660 | 5/1982 | Yano et al. | 372/45 |
| 4,546,480 | 10/1985 | Burnham et al. | 372/50 |
| 4,573,158 | 2/1986 | Utaku et al. | 372/50 |
| 4,577,321 | 3/1986 | Carney et al. | 372/45 |
| 4,630,083 | 12/1986 | Yamakoshi | 372/45 |
| 4,665,528 | 5/1987 | Chinone et al. | 372/50 |
| 4,671,830 | 6/1987 | Burnham | 372/45 |

FOREIGN PATENT DOCUMENTS

| 0187716 | 7/1986 | European Pat. Off. |
| 0194335 | 9/1986 | European Pat. Off. |
| 59-106171 | 1/1984 | Japan |
| 60-16484 | 1/1985 | Japan |
| 60-128690 | 7/1985 | Japan |
| 8500472 | 1/1985 | PCT Int'l Appl. |
| 2077484 | 12/1981 | United Kingdom |
| 2114804 | 8/1983 | United Kingdom |

OTHER PUBLICATIONS

Applied Physics Letters 47 (8), Oct. 1985 pp. 781–783.
Applied Physics Letters 45 (1), Jul. 1984 pp. 1–3.
Applied Physics Letters 48 (1), Jan. 1986 pp. 7–9.
Applied Physics Letters 49 (24), Dec. 1986 pp. 1629–1631.
Applied Physics Letters 51 (21) Nov. 1987 pp. 1664–1666.
Journal of Applied Physics 60 (8) Oct. 1986 pp. 2729–2234.
"Embedded Structure Quantum Well Laser (oscillation between higher energy levels)", by Mitsunori Sugimoto et al. Nihon Electric Co. Ltd.
"CW Multiwavelength Transverse-Junction-Stripe Lasers Grown by Molecular Beam Epitaxy Operating Predominantly in Single-Longitudinal Modes", by W. T. Tsant, Applied Physics Letters, vol. 36, pp. 441 to 443 (1980).

Primary Examiner—William L. Sikes
Assistant Examiner—Georgia Y. Epps
Attorney, Agent, or Firm—Birch, Stewart Kolasch & Birch

[57] ABSTRACT

A semiconductor laser having an active layer of quantum well structure, where the resonator loss is enhanced thereby to conduct an oscillation at a high quantum level.

113 Claims, 23 Drawing Sheets

F I G. 23.(a)
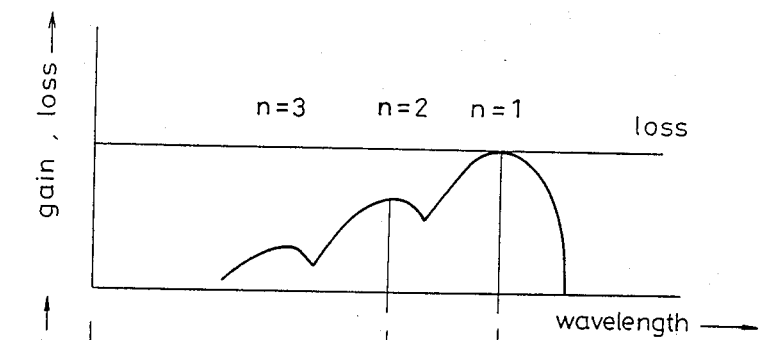

conduction band energy $L_{Z1} > L_{Z2}$ $Lz_1 = Lz_2$ $x_2 > x_1$ $Al_{x_2}Ga_{1-x_2}As \quad Al_{x_1}Ga_{1-x_1}As$ F I G .41.
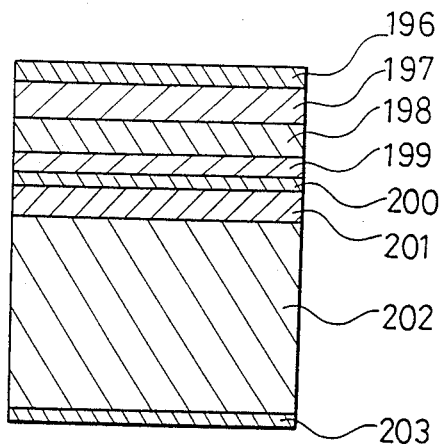
F I G .42.
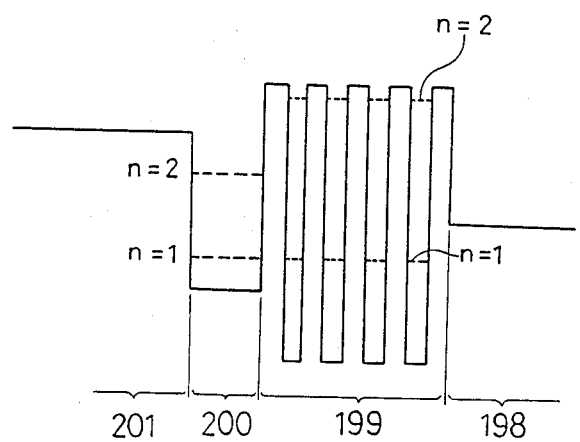

SEMICONDUCTOR LASER DEVICE

FIELD OF THE INVENTION

The present invention relates to a quantum well type semiconductor laser device, and more particularly to that capable of oscillating at higher quantum levels than the lowest quantum level.

BACKGROUND ART

In a semiconductor laser it is quite important in its application to make the laser oscillate at as short as possible wavelength.

Furthermore, laser elements which emit a plurality of different wavelength laser light beam are quite useful in such as optical communications, and there are conventionally developed a variety of types of apparatus.

FIG. 1 is a cross-sectional view showing a prior art quantum well type semiconductor laser shown in such as Appl. Phys. Lett. vol. 39, pp. 134 to 137 (1981). In FIG. 1, the reference numeral 1 designates an n+ type GaAs substrate, the reference numeral 2 designates an n type $Al_zGa_{1-z}As$ cladding layer, the reference numeral 3 designates an n type $Al_zGa_{1-z}As$ parabola type refractive index distribution layer (z gradually changes to y), the reference numeral 4 designates a p type $Al_xGa_{1-x}As$ quantum well active layer, the reference numeral 5 designates a p type $Al_yGa_{1-y}As$ parabola type refractive index distribution layer (y gradually changes to z), the reference numeral 6 designates a p type $Al_zGa_{1-z}As$ cladding layer, and the reference numeral 7 designates a p+ type GaAs contact layer.

Furthermore, FIG. 2 is a cross-sectional view showing a prior art quantum well type semiconductor laser recited in such as Appl. Phys. Lett. vol. 45, pp. 1 to 3 (1984). In FIG. 2, the reference numeral 8 designates a p type electrode, the reference numeral 9 designates a p type GaAs substrate, the reference numeral 10 designates a p type $Ga_{0.65}Al_{0.35}As$ cladding layer, the reference numeral 11 designates a p type $Ga_{0.7}Al_{0.3}As$ light guide layer, the reference numeral 12 designates a multiple quantum well layer (MQW layer). The reference numeral 13 designates an n type $Ga_{0.65}Al_{0.35}As$ cladding layer, the reference numeral 14 designates an n type GaAs contact layer, the reference numeral 15 designates a Zn diffusion region, the reference numeral 16 designates a disordered region, the reference numeral 17 designates a silicon dioxide film, and the reference numeral 18 designates an n type electrode.

FIG. 3 shows a prior art short wavelength semiconductor laser recited in Iwamura et al., Japanese Journal of Applied Physics vol. 24, No. 12, December 1985, pp. L911 to L913. The reference numeral 19 designates an n type electrode, the reference numeral 20 designates an n+ type GaAs substrate, the reference numeral 21 designates an n type AlGaAs cladding layer, the reference numeral 22 designates an n type AlGaAs confinement layer, the reference numeral 23 designates an AlGaAs/AlGaAs multi-layer quantum well active layer, the reference numeral 24 designates a p type AlGaAs confinement layer, the reference numeral 25 designates a p type AlGaAs cladding layer, the reference numeral 26 designates a p+ type GaAs contact layer, and the reference numeral 27 designates a p type electrode.

Herein, the n type AlGaAs cladding layer 22 has an aluminum composition proportion lower than that of the n type AlGaAs cladding layer 21, and the p type AlGaAs cladding layer 24 has an aluminum composition proportion lower than that of the p type AlGaAs cladding layer 25, and thus a SCH structure is produced.

A semiconductor laser in which the active layer of the usual double heterostructure laser is replaced by a quantum well structure or a superlattice structure is called a quantum well type semiconductor laser. A laser which includes a potential well layer in the active layer is called a single quantum well laser, and a laser which includes a plurality of potential well layers in the active layer is called as a multi-quantum well laser.

The operation of the semiconductor laser element having such a quantum well structure active layer will be described below.

FIG. 4 is a diagram showing the energy level in the quantum well structure. The longitudinal axis designates energy, and the transverse axis designates position perpendicular to the layers. As shown in FIG. 4, when a quantum well is constituted by putting a thin semiconductor layer between semiconductor barrier layer shaving a large energy band gap, then this thin semiconductor layer constitutes a potential well layer, and the intrinsic energy En measured from the bottom (top) of the conduction (valence) band of the electrons (holes) confined in this well is represented by the following Schrodinger equation (1), and forms discrete energy levels.

$$En = \frac{\hbar^2}{2m_e^*}\left(\frac{\pi n}{L_z}\right)^2 \quad n = 1, 2, 3 \quad (1)$$

Herein, $m_e^*$ is an effective mass of electron, $\hbar$ is a Planck'w constant divided by $2\pi$, and Lz is thickness of the quantum well layer. Herein, the thickness and height of the barrier layer are presumed to be infinity so as to enable one dimensional treating.

In this way an electron has quantized energies En, and the electron state density $\rho(E)$ becomes to have a step like distribution as shown by the real line in the quantum well, which electron state density usually has a parabola type distribution as shown in broken lines in the bulk crystal.

Accordingly, when both of the layers above and below the active layer comprising the quantum well layer are made a p type semiconductor cladding layer and an n type semiconductor cladding layer having large energy band gaps, respectively, it is possible to confine the carriers (electrons or holes) and the light in the thickness direction, which enables the production of a quantum well type semiconductor laser. A semiconductor laser constructed in this manner has an n=1 level (the lowest quantum level) higher than the bottom of the conduction band (real lines in FIG. 5) when the active layer is produced by the material which has a same energy band gap as that of the material constituting the active layer of the usual double heterostructure semiconductor laser, and therefore it oscillates at a shorter wavelength because the energy difference is larger than that of a usual double heterostructure semiconductor laser which oscillates by the energy difference between the bottom of the conduction band and the top of the valence band. Furthermore, the quantum well type semiconductor laser has discrete energy level characteristics as well as a narrow spectrum line width and a good monochromaticity.

The prior art device of FIG. 1 will be described.

First, an n type $Al_zGa_{1-z}As$ layer which will be a cladding layer 2 will be grown on the n+ type GaAs substrate 1, and subsequently, an n type $Al_zGa_{1-z}As$ (z gradually changes to y) parabola type refractive index distribution layer 3, a p type $Al_xGa_{1-x}As$ quantum well active layer 4, a p type $Al_yGa_{1-y}As$ (y gradually changes to z) parabola type refractive index distribution layer 5, a p type $Al_zGa_{1-z}As$ cladding layer 6, and a $p^{30}$ GaAs contact layer 7 will be grown (herein, z>y>x). FIG. 6 shows an energy band structure of the cladding layer, the refractive index distribution layer, and the active layer of the semiconductor laser produced in this manner.

Herein, above and below the active layer 4, the larger the aluminum composition proportion is the farther from the active layer, and the lower the refractive index is, whereby the light generated at the active layer 4 is confined within this parabola type refractive index distribution layer. Furthermore, a cavity is produced with the end facet, whereby a laser oscillation is enabled to occur. This type of laser is called as a GRIN-SCH (Graded-index waveguide separate carrier and optical confinement heterostructure) laser because of the structure in which the confinement of the carriers and light are separated.

In this prior art device, when carriers (electrons of holes) are injected biased in a forward direction, carriers are confined in the quantum well active layer 4, and the electrons and holes are recombined at discrete energy levels (n=1, n=2, ...) of the conduction band and the valence band, thereby to generate a light emission. In this place, a sharp light generation wavelength peak ($\lambda_1, \lambda_2, \lambda_3, \ldots$) in accordance with the energy levels can be obtained. In a general laser the gain at n=1 becomes larger than the resonator loss, and an oscillation occurs at the quantum level of n=1. However, when the loss is increased, combinations of carriers not only at between the n=1 quantum energy levels of the conduction band and the valence band but also those between the quantum energy levels n=2 thereof become likely to arise as shown in FIG. 4, thereby producing a laser oscillation at the quantum level of n=2. The oscillation wavelength of n=2 is fairly short relative to the oscillation wavelength of n=1 because the difference between the quantum levels n=1 and n=2 is fairly large.

Next the operation of the prior art example of FIG. 2 will be described.

FIG. 7 shows a diagram for explaining the energy band structure of the cladding layer and the multi-quantum well active layer of the prior art device of FIG. 2. In this prior art device having a MQW active layer, if the barrier layer is made quite thin, there arises overlapping of energy levels of the potential wells in the active layer, and it is possible to make almost all the electrons positioned at the lowest energy levels of a few quantum wells.

From this, in a MQW laser, the half value width of the optical gain spectrum becomes short relative to the usual DH laser caused by the stepwise state density function $\rho(E)$ as shown in FIG. 5, and the threshold value is expected to be lowered because of the higher density of states.

When a current is injected into this MQW laser which is biased in a forward direction, the electrons injected from the upper portion n electrode 18 and the positive holes injected from the lower portion p electrode 8 are confined in the GaAs well layer having a small band gap, and electrons and holes are combined to produce light emission. Light confinement in the thickness direction is accomplished by making the aluminum components in the AlGaAs layer larger as the refractive index becomes smaller, and the confinement in the transverse direction is conducted by diffusion of Zn. Accordingly, if a resonator structure is produced in addition thereto a laser oscillation will arise.

Next, the operation of the prior art device of FIG. 3 will be described.

The gain spectrum of the active layer obtained when a current is applied in the prior art device of FIG. 3 becomes as shown by the real lines of FIG. 8. Herein, n=1, 2, and 3 designate the peaks corresponding to the lowest, second lowest, and third lowest quantum levels, respectively. When a current is injected the peak corresponding to n=1 has the largest gain and a laser oscillation occurs at the wavelength corresponding to this quantum level.

In a prior art semiconductor laser of such a construction, it is required to make the quantum well layer quite thin or to increase the aluminum composition proportion in order to conduct an oscillation at a short wavelength. However, it is quite difficult to control the thickness of the quantum well layer to be quite thin, and furthermore when the aluminum composition proportion is increased end surface oxidation is likely to arise thereby to shorten the useful life of the lesser. Furthermore, when the quantum well is made thin and the aluminum composition proportion is increased the threshold current becomes high. These are obstacles to shortening the wavelength by these methods.

Furthermore in the prior art semiconductor laser with such a construction, the energy level at which the laser oscillates is controlled. Generally, an oscillation occurs at an energy level of n=1, and an oscillation at a short wavelength of n=2 is not likely to occur. In a case where an oscillation occurs at the quantum level of n=2 when the injection current is increased as described in the operation of the prior art device of FIG. 4, the oscillation wavelength difference corresponding to the energy difference $\Delta E_{12}$ between the quantum energy levels of n=1 and n=2 becomes quite large. For example, in a case of GaAs quantum well type active layer of layer thickness 100 Å, $\Delta E_{12}$ is about 110 meV and the wavelength difference is 570 Å.

The prior art semiconductor laser which emits a plurality of laser light beams will be described.

FIG. 9 shows a laser structure of a transverse junction stripe laser which emits four kinds of different wavelength light which is recited in such as Appl. Phys. Lett. vol. 36, p. 441 (1980). In FIG. 9, the reference numeral 28 designates an upper portion electrode, the reference numeral 29 designates a silicon nitride current blocking layer, the reference numeral 30 designates an n type $Al_yGa_{1-y}As$ cladding layer, the reference numeral 31 designates an n type $Al_{x1}Ga_{1-x1}As$ first active layer, the reference numeral 32 designates an n type $Al_{x2}Ga_{1-x2}As$ second active layer, the reference numeral 33 designates an n type $Al_{x3}Ga_{1-x3}As$ third active layer, the reference numeral 34 designates an n type $Al_{x4}Ga_{1-x4}As$ fourth active layer, the reference numeral 35 designates an n type GaAs substrate, the reference numeral 36 designates a lower portion electrode, the reference numeral 37 designates a Zn diffusion region which is shown by diagonal lines, and the reference numeral 38 designates a Zn driven region which is shown by broken lines.

Herein, the aluminum composition proportions of the cladding layer and active layer are in a relation that $x_1 < x_2 < x_3 < x_4 < y$.

FIG. 10 shows an array in which three lasers are integrated on a substrate which is recited in such as Appl. Phys. Lett. vol. 48, p. 7 (1986). In FIG. 10, the same reference numerals designate the same elements as those shown in FIG. 9. The reference numeral 30 designates a p type GaAs contact layer, the reference numeral 40 designates a p type AlGaAs cladding layer, the reference numeral 41 designates an AlGaAs/GaAs multi-layer quantum well active layer, the reference numeral 42 designates an n type AlGaAs cladding layer, the reference numeral 43 designates a Si diffusion layer (shown by diagonal lines), and the reference numeral 44 designates a proton irradiated region (shown by dotted lines).

The device will be operated as follows.

In FIG. 9 the holes which flow from the p side upper electrode 28 and the electrons which flow from the n side lower electrode 36 proceed along the path designated by the arrows in the figure, and they generate light emissions at the four active layers 31, 32, 33, and 34. Herein, wavelengths of the generated light beams are such that $\lambda_1 < \lambda_2 < \lambda_3 < \lambda_4$ because $x_1 < x_2 < x_3 < x_4$ ($\lambda_n$ designates the wavelength of light which is emitted from the n-th active layer).

In FIG. 10, holes which flow from the upper electrode 28 and electrons which flow from the lower electrode 36 are recombined at the three active layers 41 which are not diffused by silicon, thereby to occur an oscillation.

The prior art multi-wavelength oscillation laser can be produced only in a transverse junction stripe type which is shown in FIG. 9. This method has a problem in cost because the process thereof is a complicated one. Furthermore, such a prior art multi-wavelength oscillation laser is one which emits a plurality of wavelengths at the same time, and it is impossible to produce an oscillation with switching one by one. Furthermore, in the laser array shown in FIG. 10 the three active layers emit the same wavelength light, and it is impossible to conduct multiplexing of different wavelength light.

FIG. 11(a) and (b) shows a construction of a prior art wavelength multiplexed optical communication integrated semiconductor laser which is recited in Appl. Phys. Lett. vol. 29, p. 506 (1976).

In FIG. 11, the reference numeral 45 designates an n electrode, the reference numeral 46 designates a p electrode, the reference numeral 47 designates an n type GaAs substrate, the reference numeral 48 designates n type $Al_{0.3}Ga_{0.7}As$, the reference numeral 49 designates Zn diffusion front, the reference numeral 50 designates p type GaAs, the reference numeral 51 designates p type $Al_{0.2}Ga_{0.8}As$, the reference numeral 52 designates a p type $Al_{0.07}Ga_{0.93}As$, and the reference numeral 53 designates a periodic concavo-convex. Furthermore, the reference numeral 54 designates a laser, the reference numeral 55 designates a waveguide, the reference numeral 56 designates a coupler, and the reference numeral 57 designates an optical fiber.

This laser produces oscillation caused by distribution feedback being conducted by the periodical concavo-convex. When the period of the concavo-convex is made $\Lambda$, the oscillation wavelength $\lambda$ becomes as in the following.

$$\lambda = 2n\Lambda/m \quad (2)$$

Herein, n designates an effective refractive index of the waveguide, and m designates an integer. The $\Lambda$ is quite small, and the production of the concavo-convex is difficult. Accordingly, m=3 is usually used.

As shown in FIG. 11(b), when $\Lambda$ is changed slightly in several waveguides 55 light beams of different wavelengths are obtained from the formula (2). However, in a case of producing such an integrated laser, producing concavo-convex which have slightly different $\Lambda$ on the respective waveguides is difficult and the concavo-convex are likely to be destroyed due to the second epitaxial growth. This results in a bad yield and difficulty in production, thereby leading to a high cost.

SUMMARY OF THE INVENTION

An object of the present invention is to provide a semiconductor laser capable of oscillating at a short wavelength using the usual material.

A second object of the present invention is to provide a quantum well type semiconductor laser capable of varying the oscillation wavelengths by a small injection current difference.

A third object of the present invention is to provide a semiconductor laser capable of simultaneously or switchingly oscillating a plurality of different wavelength laser light beams from an active layer.

A fourth object of the present invention is to provide a laser array which emits different wavelengths and which can be produced by a simplified process.

A fifth object of the present invention is to provide an integrated semiconductor laser including a plurality of semiconductor lasers integrated by a one time crystal growth together, which lasers have systematically differentiated oscillation wavelengths.

Other objects and advantages of the present invention will become apparent from the detailed description given hereinafter; it should be understood, however, that the detailed description and specific embodiments are given by way of illustration only, since various changes and modifications within the spirit and scope of the invention will become apparent to those skilled in the art from this detailed description.

According to the present invention, there is provided a semiconductor laser having an active layer of quantum well structure, where the resonator loss is enhanced thereby to conduct an oscillation at a high quantum level.

BRIEF DESCRIPTION OF THE DRAWINGS

FIG. 41 is a diagram showing the structure of the semiconductor laser of a tenth embodiment of the present invention;

FIG. 42 is a diagram showing the energy band structure of the tenth embodiment of the present invention;

DETAILED DESCRIPTION OF THE PREFERRED EMBODIMENTS

Figure 12:
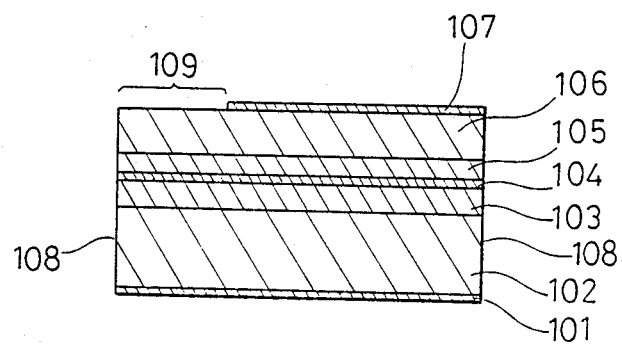
FIG. 12 is a diagram showing a structure of a semiconductor laser as a first embodiment of the present invention.

In order to explain a first embodiment of the present invention, reference will be particularly made to FIG. 12.

In FIG. 12, the reference numeral 101 designates an n type electrode, the reference numeral 102 designates as n type GaAs substrate, the reference numeral 103 designates an n type AlGaAs cladding layer, the reference numeral 104 designates a GaAs quantum well active layer, the reference numeral 105 designates a p type AlGaAs cladding layer, the reference numeral 106 designates a p type GaAs contact layer, the reference numeral 107 designates a p type electrode, the reference numeral 108 designates an end surface mirror, and the reference numeral 109 designates a light absorption region.

The principle of operation of this embodiment will be described.

Generally a laser oscillation arises when the gain of the resonator overcomes the cavity loss (the sum of the reflection loss caused by a portion of the light corresponding to the transmittivity released due to the finite reflectivity and the absorption and scattering loss which occur in the transmission in the active layer) while the light is reciprocated.

$$g_{th} \cdot \xi = \alpha + \frac{1}{L} \ln \frac{1}{\sqrt{R_1 R_2}} \qquad (3)$$

That is, a laser oscillation occurs when gain available becomes larger that $g_{th}$. Herein, $g_{th}$ is threshold gain, $\xi$ is optical confinement factor, $\alpha$ is absorption and scattering loss, L is resonator length, $R_1$ and $R_2$ are reflectivities of the end surface (generally $R_1=R_2=R$).

Furthermore, $\alpha$ is written as in the following.

$$\alpha = \alpha_{ac}\cdot\xi + \alpha_{ex}(1-\xi) + \alpha_s \quad (4)$$

Figure 1:
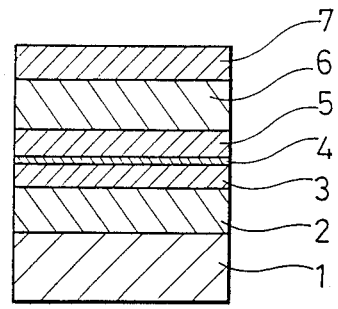
FIG. 1 is a diagram showing a structure of a prior art quantum well laser.
Figure 2:
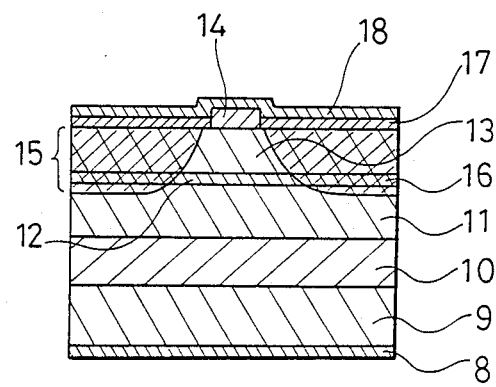
FIG. 2 is a diagram showing a structure of another prior art quantum well laser.
Figure 3:
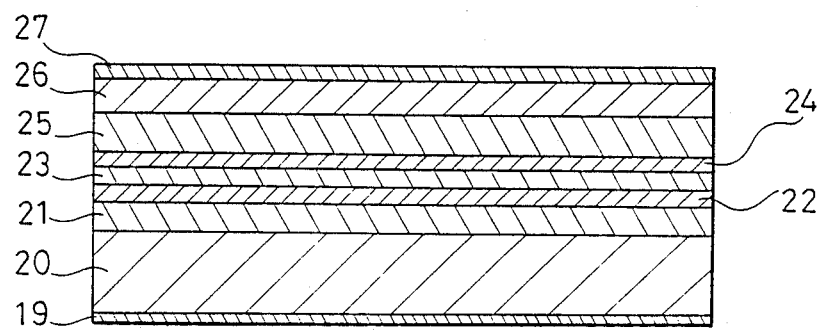
FIG. 3 is a diagram showing a structure of a prior art quantum well laser having a SCH structure.
Figure 4:
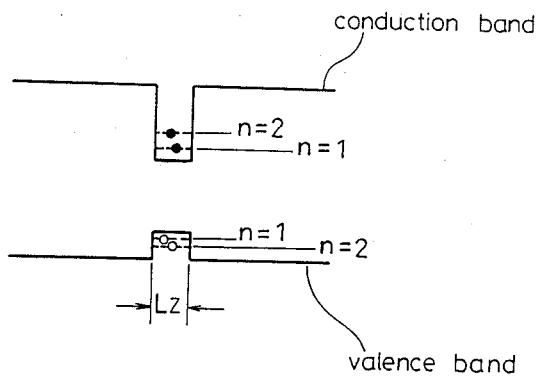
FIG. 4 is a diagram showing the energy band gap structure of the quantum well active layer.
Figure 5:
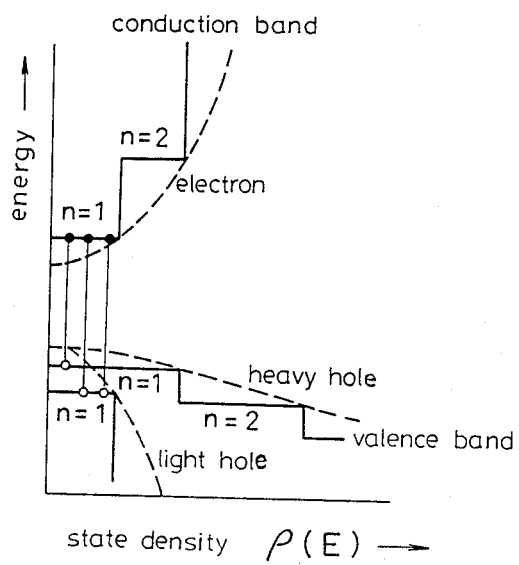
FIG. 5 is a diagram showing the state density and energy levels of the quantum well.
Figure 6:
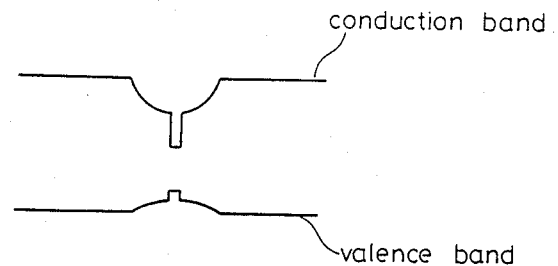
FIG. 6 is a diagram showing the energy band structure of a semiconductor laser of a GRIN-SCH structure.
Figure 7:
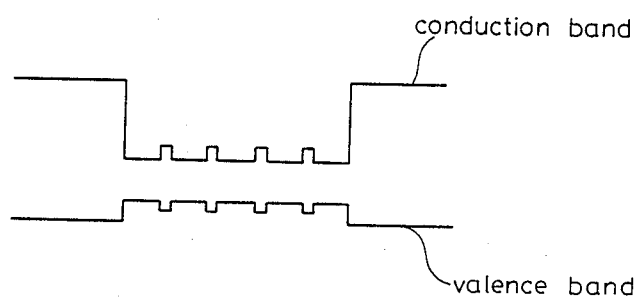
FIG. 7 is a diagram showing the energy band gap structure of a multiple quantum well active layer.
Figure 8:
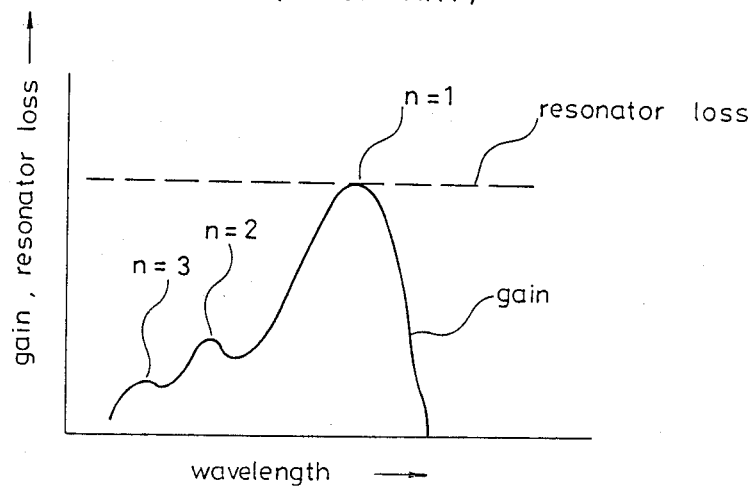
FIG. 8 is a diagram showing the wavelength vs gain and resonator loss characteristics of a prior art semiconductor laser.
Figure 9:
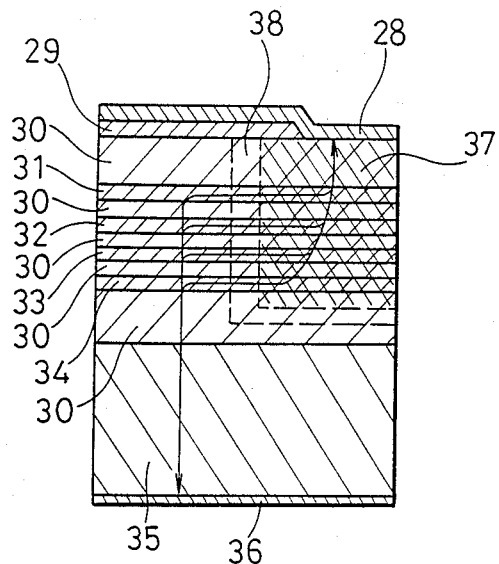
FIG. 9 is a diagram showing a structure of a prior art multi-wavelength oscillation laser.
Figure 10:
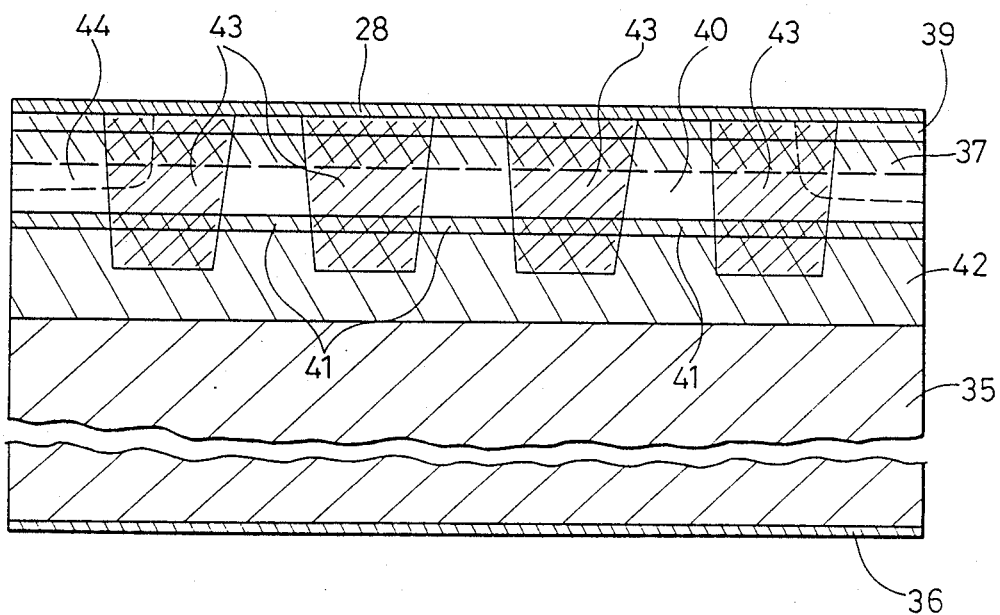
FIG. 10 is a diagram showing a structure of a prior art laser array.
Figure 11:
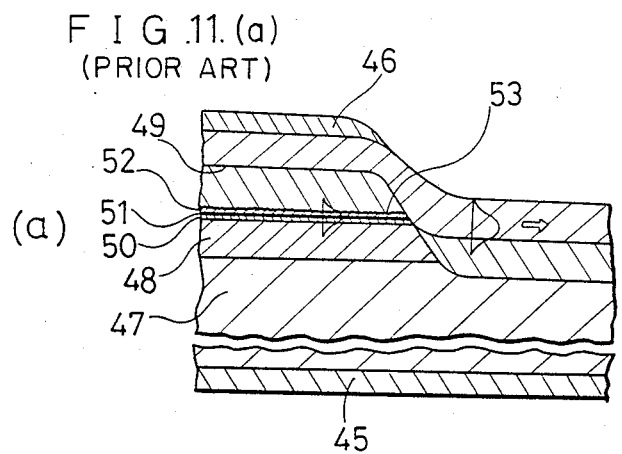
FIGS. 11(a) and (b) are diagrams showing structures of another prior art multi-wavelength oscillation laser.
Figure 11:
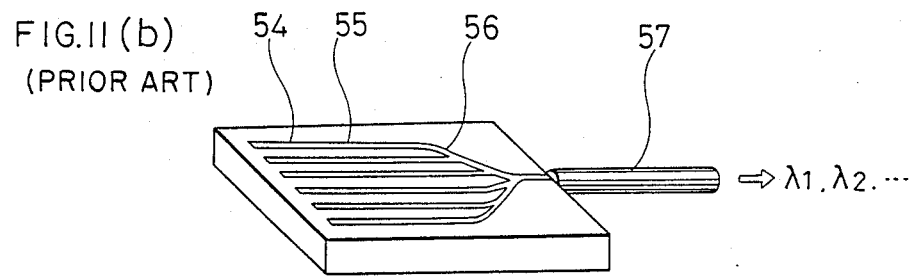

Herein, $\alpha_{ac}$ is an absorption in the active layer, $\alpha_{ex}$ is an absorption in the cladding layer, and $\alpha_s$ is scatterng loss. By the way, in the semiconductor laser having a quantum well in the active layer, the energy level which the resonator can have is quantized as shown in FIG. 5, and generally the relationship between the gain and the wavelength becomes to have a characteristics as shown in FIG. 13.

That is, when the injection current is increased, there is a peak at the wavelength of the quantum level of $n=1$, and next the peak transits to the quantum level of $n=2$. The wavelength is shorter at the quantum level of $n=2$.

Figure 13:
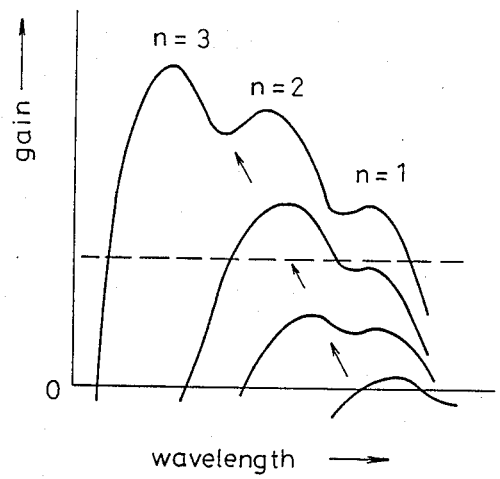
FIG. 13 is a diagram showing the relationship between the oscillation wavelength and the gain for exemplifying the operation principle of the present invention.

When the absorption loss in the lightguide of the active layer is increased and it is set at a value shown by the broken lines in FIG. 13, the oscillation at the quantum level $n=1$ does not arise and an oscillation peak at $n=2$ is obtained. Accordingly, it is possible to obtain laser lights of $n=1$ and $n=2$ or a laser light of a high energy level $n=2$ by only changing the injection current when the resonator loss is previously adjusted.

In the first embodiment of the present invention there are p type AlGaAs cladding layer 105 and n type AlGaAs cladding layer 103 above and below the GaAs quantum well active layer 104, and these cladding layers have larger energy band gaps than that of the active layer 104 and smaller refractive indices than that of the active layer. Accordingly, the confinement of carriers (electrons or holes) and the confinement of light are conducted, and it is possible to conduct an amplification oscillation between the reflective end surfaces 108 of the resonator.

In this type of laser, carrier recombinations occur at a portion above which the p type electrode 107 is located, and a gain is obtained thereat, while at a portion above which the electrode 107 is not located the light guide path therebelow becomes a light absorption region 109, thereby increasing the loss $\alpha_{ac}$. Due to this loss, the resonator loss $\alpha$ increases. In this way, it is possible to adjust the characteristics at a position of broken lines in FIG. 13 by increasing the threshold value $g_{th}$ of the active layer gain, and then an oscillation does not occur at the wavelength of the $n=1$ level and it is possible to produce an oscillation at the wavelength of $n=2$.

In the above-illustrated embodiment in order to increase the light absorption loss at the inside of the light guide path a portion above which the upper electrode is not located is provided to produce a light absorption region, but this may be conducted by other methods.

Figure 14:
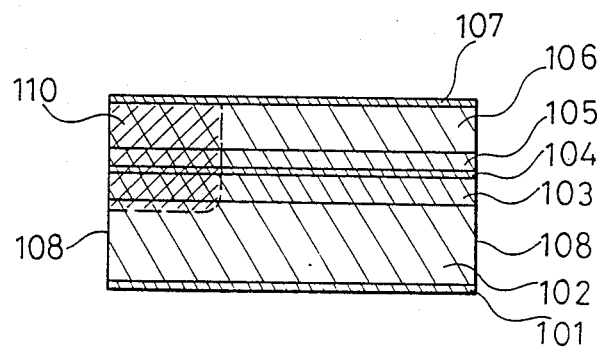
FIG. 14 is a diagram showing the alternative of a first embodiment of the present invention.

FIG. 14 shows an alternative of this first embodiment. In this alternative a high resistivity layer 110 may be produced by irradiating protons into a portion of the light guide (active layer 104), thereby producing a light absorption region. This alternative is expected to accomplish the same effects as those of the first embodiment.

Figure 15:
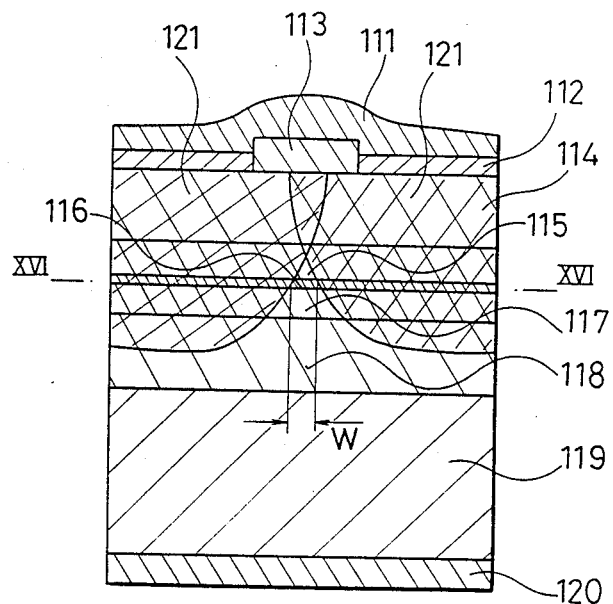
FIG. 15 is a diagram showing the structure of the semiconductor laser of the first embodiment of the present invention.

FIG. 15 shows a second embodiment of the present invention. In FIG. 15, the reference numeral 111 designates an upper electrode, the reference numeral 112 designates a silicon dioxide current blocking layer, the reference numeral 113 designates a p type GaAs contact layer, the reference numeral 114 designates a p type AlGaAs cladding layer, the reference numeral 115 designates, for example, a p type AlGaAs-GaAs superlattice graded index waveguide layer, the reference numeral 116 designates, for example, a GaAs active layer of 100 Å, the reference numeral 117 designates, for example, an n type AlGaAs-GaAs superlattice graded index waveguide layer, the reference numeral 118 designates as n type AlGaAs cladding layer, the reference numeral 119 designates an n type GaAs substrate, the reference numeral 120 designates a lower electrode, and the reference numeral 121 (a portion of oblique line) designates a Zn diffusion layer.

Figure 16:
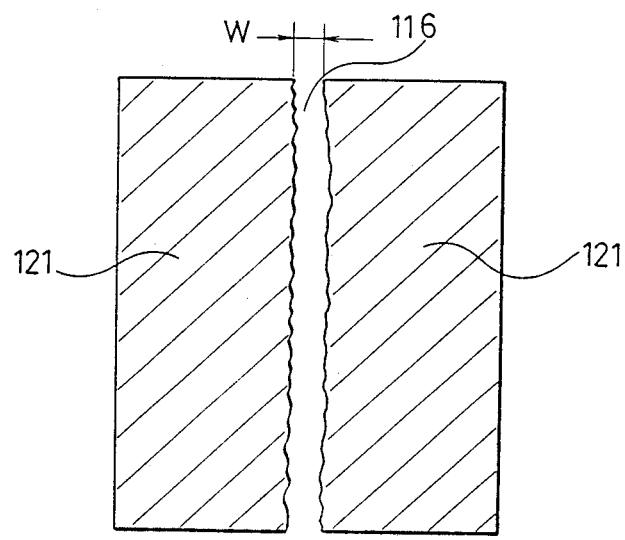
FIG. 16 is a diagram showing a cross-section in lines XVI to XVI of FIG. 15.

FIG. 16 shows a cross-section in lines XVI—XVI of FIG. 15. As shown in FIG. 16 the edge of the active layer stripe is in a configuration of slight concavo-convex.

Figure 17:
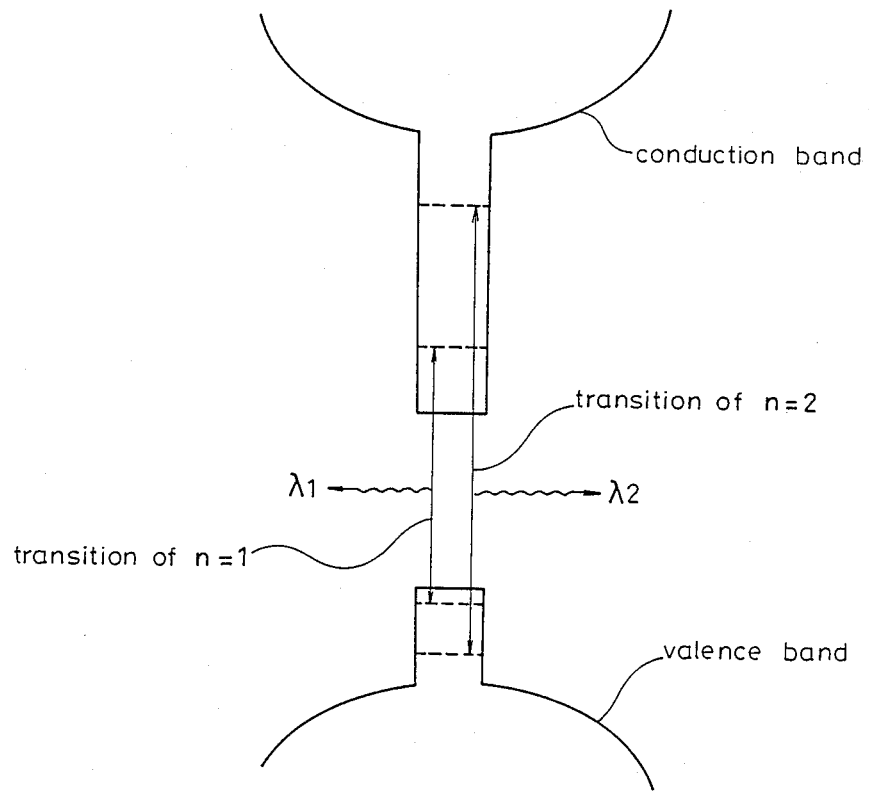
FIG. 17 is a diagram showing the energy band structure of the active layer portion of the second embodiment semiconductor laser.

FIG. 17 shows an energy band structure at the active layer of this embodiment. In the curving portion the energy band is varying in a parabola shape by the GRIN-SCH structure.

In the semiconductor laser of this embodiment, a GRIN-SCH structure is constituted by providing the superlattice graded index waveguide layers 115 and 117 between the upper and lower cladding layers provided above and below the active layer, thereby conducting the confinement of light in the thickness direction. Furthermore, the energy band gaps of the upper and lower cladding layers are sufficiently high, and the active layer 116 is produced sufficiently thin to be 100 Å, whereby the active layer 116 produces a quantum well structure and carriers injected into the active layer have quantized energy band gaps. Furthermore, the Zn diffusion region 121 has a high band gap, and a low refractive index, whereby the carriers and generated lights in the active layer are transversely confined in the width of W into which no diffusion of Zn is conducted.

The device will be operated as follows.

When carriers are injected into the semiconductor laser of this embodiment constructed as described above, electrons and holes conduct transitions inside the active layer between the quantized energy levels in accordance with the number of injected carriers, thereby generating a light of wavelength corresponding to the respective quantum level. When the gain becomes larger than the resonator loss there produces a laser oscillation.

As shown in FIG. 16, the edges of the active layer stripe are in configurations of concavo-convex, the generated light is considerably scattered at these portions, and this increases the resonator internal loss. Furthermore, the resonator internal loss is increased by narrowing the stripe width. When this stripe width is made about 4 μm and the resonator internal loss is increased sufficiently, a laser oscillation of wavelength $\lambda_1$ corresponding to the quantum level of $n=1$ occurs by the transition at quantum level $n=1$ in the active layer shown in FIG. 17 thereby generating a light of wavelength $\lambda_1$ while the numbers of injected electrons and holes are small, that is, when the injected current is small. However, when the injected current is increased, the state density of carriers at the quantum level of $n=2$ is larger than that of the quantum level of $n=1$, and the gain at $n=2$ becomes larger than that which is caused by that at $n=1$, and a light of wavelength $\lambda_2$ corresponding to the quantum level $n=2$ is generated. By this, the oscillation at n=1 is suppressed. However, by establishing the resonator internal loss at a predetermined value and supplying a predetermined current it is possible to generate lights of wavelength $\lambda_1$ and $\lambda_2$ at the same time.

As described above in this second embodiment which is constituted such that the oscillation at the quantum level n=2 is likely to arise by increasing the resonator internal loss of the quantum well type semiconductor laser, it is possible to switch the oscillation wavelength by switching the injection current, or it is possible to emit a plurality of wavelengths of laser lights at the same time from an active layer by giving a predetermined injection current.

Figure 18:
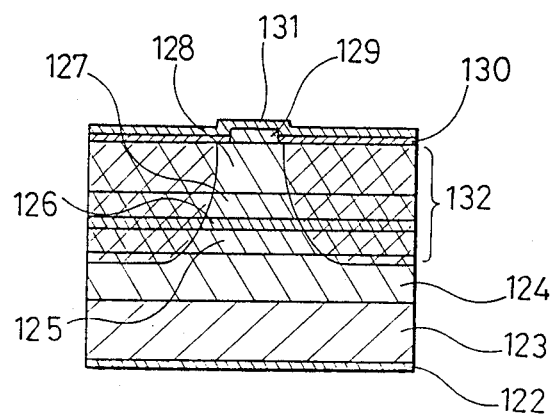
FIG. 18 is a diagram showing the structure of the semiconductor laser of the third embodiment of the present invention.

FIG. 18 shows a third embodiment of the present invention. In FIG. 18, the reference numeral 122 designates a p type electrode, the reference numeral 123 designates a p+ GaAs substrate, the reference numeral 124 designates a p type $Al_zGa_{1-z}As$ cladding layer, the reference numeral 125 designates a p type $Al_zGa_{1-z}As$ parabola type refractive index distribution layer (z changes gradually to y), the reference numeral 126 designates a GaAs quantum well active layer, the reference numeral 127 designates an n type $Al_yGa_{1-y}As$ parabola type refractive index distribution layer (y changes gradually to z), the reference numeral 128 designates an n type $Al_zGa_{1-z}As$ cladding layer, the reference numeral 129 designates an n type GaAs contact layer, the reference numeral 130 designates a silicon dioxide film, the reference numeral 131 designates an n type electrode, and the reference numeral 132 designates a Zn diffusion layer (x<y<z).

In this embodiment, the p type $Al_zGa_{1-z}As$ cladding layer 124, p type $Al_zGa_{1-z}As$ parabola type refractive index distribution layer 125, GaAs quantum well active layer 126, n type $Al_yGa_{1-y}As$ parabola type refractive index distribution layer 127, n type $Al_zGa_{1-z}As$ cladding layer 128, and n+-GaAs contact layer 129 are successively produced by crystal growth, and a stripe mask is provided thereon, and a Zn diffusion is conducted to produce the diffusion layer 123. The quantum well layer 126 of the active layer to which Zn diffusion is conducted generates mixture crystal with the refractive index distribution layer 125 and 127, and the energy band gap thereof becomes larger than that of the GaAs quantum well layer, and the refractive index becomes small. Accordingly, when an end surface vertical with the active layer is produced as a reflection surface provided with a p type electrode 122 and an n type electrode 131, the injected carriers (electrons and holes) are confined in the GaAs quantum well layer 5 having a small energy band gap, and recombinations of electrons and holes occur to generate a light emission. The emitted light is confined in the thickness direction by the parabola type refractive index distribution layer and is confined in the transverse direction by the low refractive index layer which is generated by the diffusion, thereby producing a laser oscillation.

In this third embodiment the loss at the light absorption region at the outside of the lightguide of the active layer is increased (the portion to which diffusion is conducted has a large loss because the carrier concentration is high), and the resonator loss is set at a value shown by the dotted lines in FIG. 13 which is described in the first embodiment. By this an oscillation at n=1 does not arise and an oscillation peak of n=2 is obtained. Accordingly, although it is only possible to produce an oscillation of the lowest level of n=1 by the relaxation phenomenon in a general multiple quantum well laser, it is possible to obtain laser lights of n=1 and n=2 or laser light of higher energy level than n=2 by only changing the injection current when the resonator loss is previously adjusted.

In the above-described third embodiment, an increase in the absorption loss due to diffusion is utilized so as to increase the resonator internal loss at the light absorption region outside the light waveguide. However, it is also possible to accomplish the same effects as the above-described embodiments by irradiating protons to the portion other than the stripe because the proton irradiation produces a high resistivity region 133, restricts the current at the region, and thus, enables utilization of utilizing the portion as a light absorption layer as in an alternative of the third embodiment shown in FIG. 19.

Figure 20:
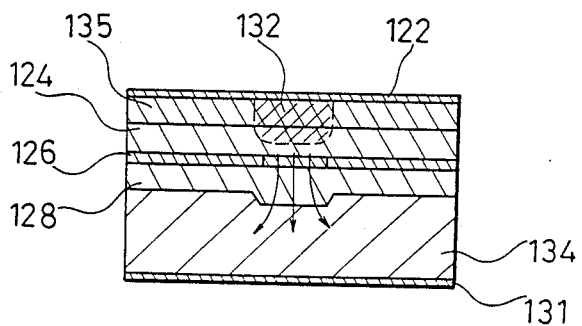
FIG. 20 is a diagram showing another alternative of the third embodiment.
Figure 21:
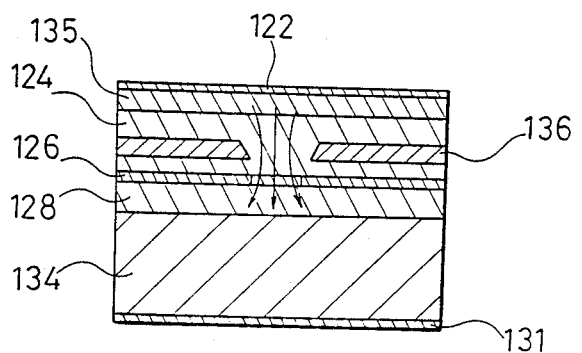
FIG. 21 is a diagram showing the other alternative of the third embodiment.

Furthermore as shown in alternatives of the FIGS. 20 and 21, it is also possible to increase the light absorption capacity of the region other than the active layer by conducting the current restriction structurally as such CSP (Channel Substrate Planar Laser) or SAS (Self-Aligned Structure Laser).

Figure 19:
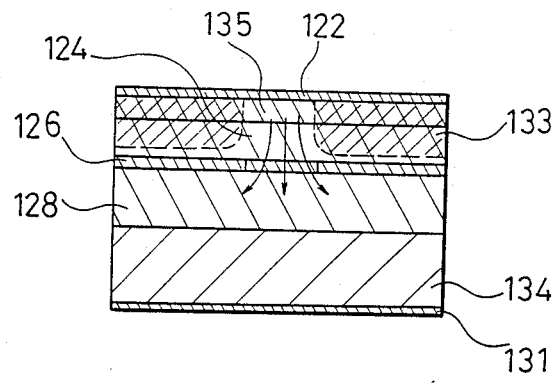
FIG. 19 is a diagram showing the alternative of the third embodiment.

In FIGS. 19, 20, and 21 the same reference numerals designate the same elements as those shown in FIG. 18. The reference numeral 134 designates an n type GaAs substrate, the reference numeral 135 designates a p type GaAs contact layer, the reference numeral 136 designates an n type GaAs light guide layer, and these alternatives have the reverse conductivity types to those of the layers of the third embodiment of FIG. 18.

Figure 22:
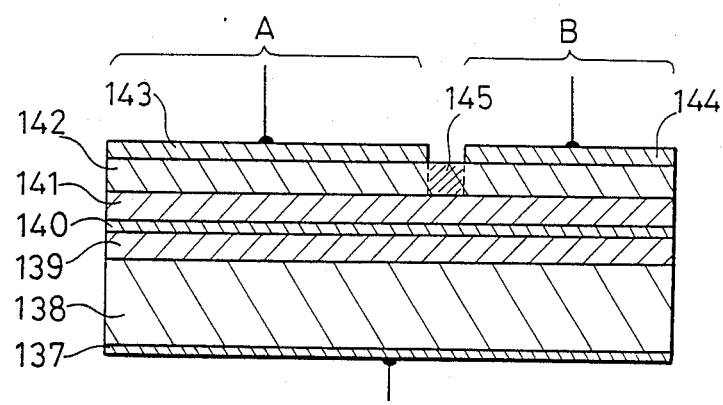
FIG. 22 is a diagram showing the structure of a semiconductor laser of a fourth embodiment of the present invention.

FIG. 22 shows a fourth embodiment of the present invention. In FIG. 22, the reference numeral 137 designates a lower electrode, the reference numeral 138 designates an n type GaAs substrate, the reference numeral 139 designates a lower n type AlGaAs cladding layer, the reference numeral 140 designates a GaAs quantum well active layer, the reference numeral 141 designates an upper p type AlGaAs cladding layer, the reference numeral 142 designates a p type GaAs contact layer, the reference numeral 143 designates an electrode for current injection, the reference numeral 144 designates an electrode for loss modulation, and the reference numeral 145 designates an insulating region for electrically separating the current injection portions A and B.

The device will be operated as follows.

Figure 23B:
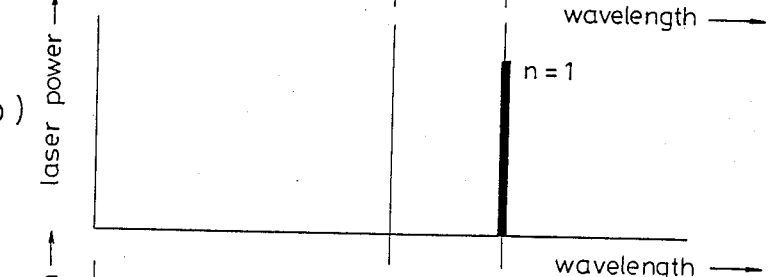
FIG. 23 is a diagram for explaining the operation of the fourth embodiment.

FIG. 23(a) shows a gain spectrum of this fourth embodiment. n=1, 2, 3, . . . designate the gain peaks corresponding to the transitions at the first, second, and third quantum levels of the electrons and holes, respectively. FIG. 23(a) shows a case where an oscillation of transition corresponding to n=1 is produced as the gain of n=1 is balanced with the resonator loss. FIG. 23(b) shows an oscillation spectrum in this case.

Furthermore, it is known that the exciton peak of the absorption spectrum (n=1, 2, 3, . . . ) is shifted by 20 to 30 meV to the high energy side relative to the respective laser oscillation wavelength.

Figure 23C:
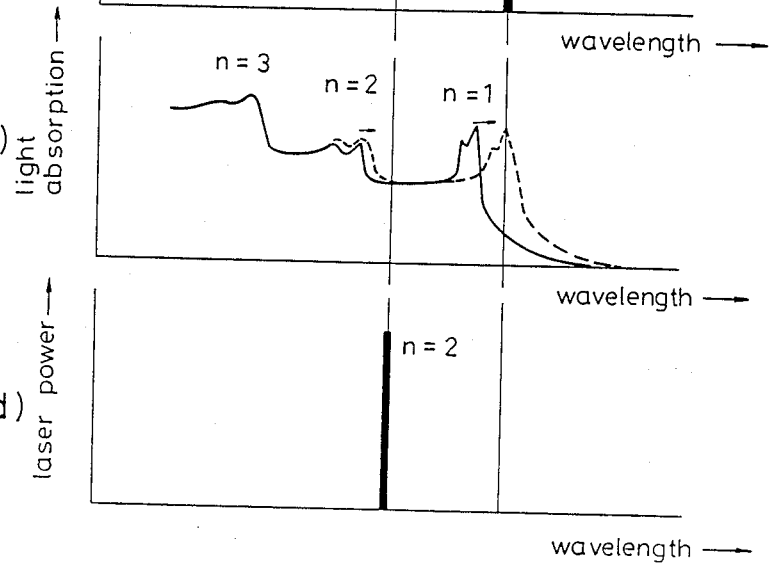

Next, a reverse bias is applied to the loss modulation portion so as to shift the exciton peak to the oscillation wavelength of n=1 as shown in FIG. 23(c) (the real lines show the absorption spectrum when the applied voltage is 0, and the broken lines show an absorption spectrum when the reverse bias voltage application is conducted).

Figure 23D:
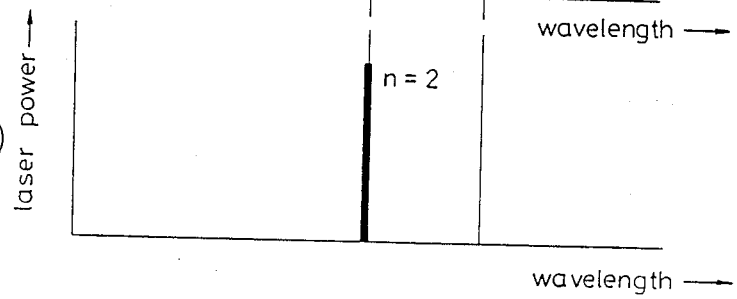

By this, a resonator internal loss is induced against the laser oscillation wavelength corresponding to n=1, and this laser oscillation is supressed. As a result, the consumption of carrier population caused by the induced emission from the quantum level n=1 is gone, and the carriers become to occupy the quantum level of n=2. As shown in FIG. 23(c), the shift of the exciton peak corresponding to n=2 is small, and the resonator internal loss due to the reverse bias voltage application has almost no effect on the corresponding laser oscillation. Accordingly, a laser oscillation corresponding to this transition arises. FIG. 23(d) shows an oscillation spectrum of this case. In this way, when the reverse bias is not applied a laser oscillation corresponding to the quantum level n=1 is conducted, and when the reverse bias is applied a laser oscillation corresponding to the quantum level n=2 is conducted.

As described above, in this embodiment an electrode for applying a reverse bias to the same layer structure as that to which a gain current is injected is provided in a semiconductor laser having a quantum well structure, whereby the internal loss is selectively enhanced in accordance with the oscillation wavelength by the control of the voltage applied from this electrode, whereby an oscillation at a high quantum level is enabled, and the switching of the oscillation wavelengths is facilitated by this control.

Figure 24:
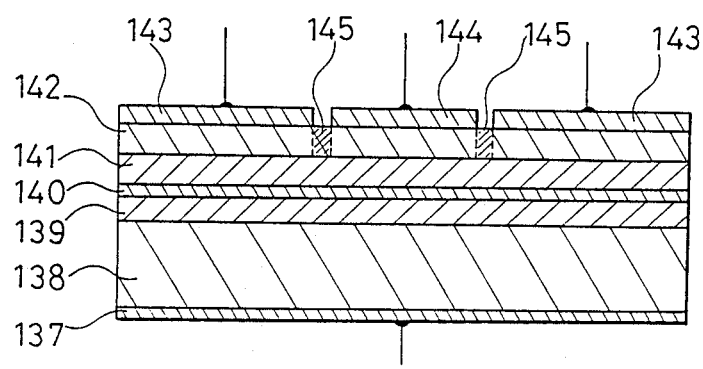
FIG. 24 is a diagram showing an alternative of the fourth embodiment.

In the above-described fourth embodiment the loss modulation portion B is provided at one side of laser end surfaces, but this may be provided at the central portion of the laser as in the alternative of this fourth embodiment shown in FIG. 24.

Furthermore, the active layer may be of a multiple quantum well structure having a plurality of quantum well layers of a single well structure. Furthermore, the present invention may be applied to a semiconductor laser of a ridge weaveguide type, a BH (Buried Heterostructure) type, a CSP (Channeled Substrate Planar) type, or a superlattice disordered type.

Furthermore in the above-illustrated embodiment, the laser oscillations of n=1 and n=2 are described, but the present invention may be applied to one conducting a laser oscillation corresponding to a further higher quantum level.

Figure 25:
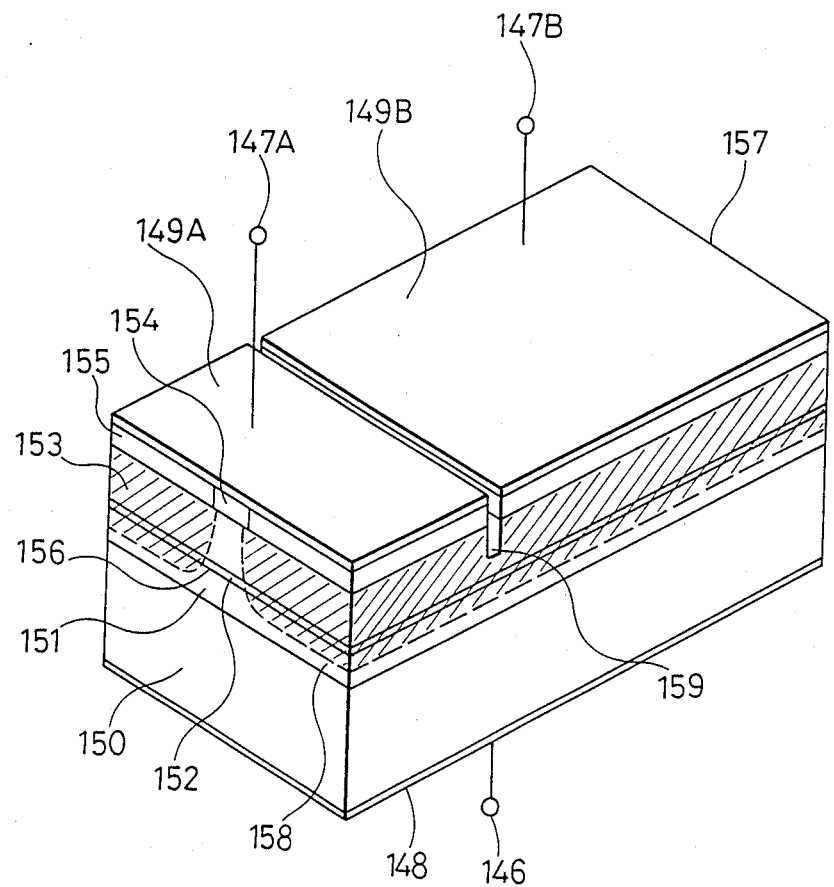
FIG. 25 is a diagram showing the structure of the semiconductor laser of the fifth embodiment.

FIG. 25 shows a fifth embodiment of the present invention. In FIG. 25, the reference numerals 146, 147A, and 147B designate current terminals, the reference numerals 148, 149A, 149B designate electrodes, the reference numeral 150 designates an n+ type GaAs substrate, the reference numeral 151 designates an n type AlGaAs cladding layer, the reference numeral 152 designates a quantum well active layer, the reference numeral 153 designates a p type AlGaAs cladding layer, the reference numeral 154 designates a p+ type GaAs contact layer, the reference numeral 155 designates an insulating film, the reference numeral 158 designates a diffusion front of p type dopants, and the reference numeral 159 designates a groove for separating the electrodes 149A and 149B. The reference numerals 156 and 157 designate cleavage planes constituting a Fabry Perot resonator. The diffused p type dopants conduct a function of producing a stripe light waveguide vertical with the axis of the resonator at the quantum well active layer 152. Generally, when the stripe wells are narrowed, an absorption arises caused by free carriers of the light guided at the diffusion region at the neighbourhood of the lightguide.

The device will be operated as follows.

Suppose that the length of the light waveguide in the resonator length direction below the electrode 149A is $L_A$, the gain at the region of the light waveguide is $g_A$, the resonator internal loss at the regions is $\alpha_A$, the length of the lightguide in the resonator length direction below the electrode 149B is $L_B$, the gain at the region of the lightguide is $g_B$, the resonator internal loss at the region is $\alpha_B$, and the reflectivity of the cleavage planes 156 and 157 are R. Then, this laser produces an oscillation when forward direction currents are provided between the electrode terminals 146 and 147A and between the electrode terminals 146 and 147B, and gains $g_A$ and $g_B$ are increased by these current injections, and the following formula is satisfied.

$$g_A L_A + g_B L_B > \alpha_A L_A + \alpha_B L_B + l_n 1/R \ldots (5)$$

Herein, if the electrode 149A is an electrode for oscillation and the electrode 149B is considered to be an electrode for the wavelength control, the above formula (5) may be rewritten as in the following.

$$g_A > \alpha_A + (\alpha_B - g_B)\frac{L_B}{L_A} + \frac{1}{L_A} \cdot \ln\frac{1}{R} \quad (6)$$

This formula (6) is in a form in which the loss $(\alpha_B - g_B)L_B/L_A$ is effectively added to the resonator loss of the formula (3) which corresponds to a device in which the electrode is not divided as in the first embodiment.

Now suppose that a current is not applied to the electrode 149B ($g_B=0$) and a current is supplied to the electrode 149A and $\alpha_B L_B/L_A$ is taken large to some degree, the gain $g_{A1}$ corresponding to the quantum level n=1 does not satisfy with the formula (3), and the laser oscillation corresponding to the quantum level n=1 does not arise. When an injection current is further increased, the current gain $g_{A2}$ corresponding to the quantum level n=2 becomes larger than $g_{A1}$, and the formula (6) is satisfied by the gain $g_{A2}$. Then, the semiconductor laser of this embodiment conducts a laser oscillation at the wavelength corresponding to the quantum level n=2.

When a current is supplied to the electrode 149B in this state, the gain $g_B$ increases and the effective loss $(\alpha_B - g_B) L_B/L_A$ in the formula (6) decreases, and the gain $g_{A1}$ becomes to satisfy the formula (6) and a laser oscillation of the wavelength corresponding to the quantum level n=1 will arise.

Accordingly, in this embodiment it is possible to switch the oscillations of n=1 and n=2 by changing the injection current from the electrode 149B. Furthermore, it is possible to conduct the laser oscillations of the both wavelengths of n=2 and n=1 at the same time by using the transition states in transitting from the laser oscillation of n=2 to that of n=1.

Furthermore in the above-illustrated embodiment, the active layer is made of a single quantum well layer, but the active layer may be of a multiple quantum well layer or a separate confinement structure quantum well layer.

Furthermore in the above-illustrated embodiment, the electrode is divided into two pieces, but when this number of divisions is increased, it is possible to compensate the indeterminacy of the loss $\alpha$ which is difficult to be controlled, and it is possible to obtain a semiconductor laser having a switching function easily.

Figure 26:
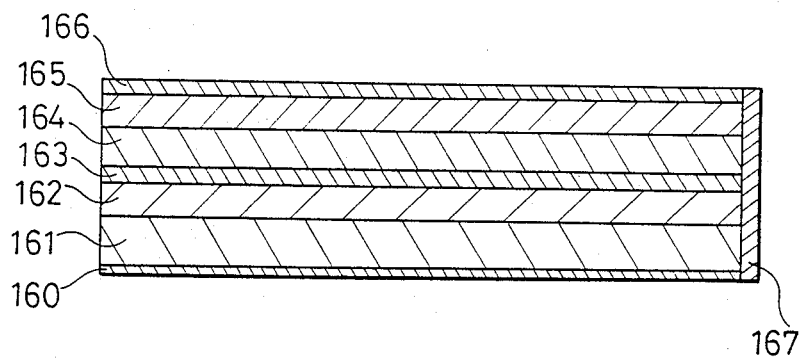
FIG. 26 is a diagram showing the structure of the semiconductor laser of the sixth embodiment.

FIG. 26 shows a sixth embodiment of the present invention. In FIG. 26 the reference numeral 160 designates a lower electrode, the reference numeral 161 designates a substrate, the reference numeral 162 designates a first conductivity type cladding layer, the reference numeral 163 designates a quantum well active layer, the reference numeral 164 designates a second conductivity type cladding layer, the reference numeral 165 designates a contact layer, the reference numeral 166 designates an upper electrode, and the reference numeral 167 designates a reflection film having a wavelength selectivity.

The device will be operated as follows.

Figure 27:
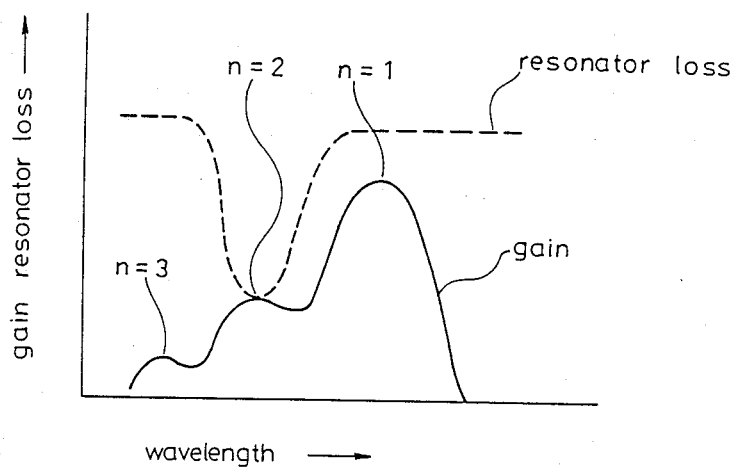
FIG. 27 is a diagram showing the wavelength vs gain and resonator loss characteristics of the sixth embodiment.

The gain spectrum of the active layer 163 is shown by the real lines in FIG. 27. The point designated by n=1 is the gain peak corresponding to the transition between the lowest quantum levels, and the points designated by n=2, 3 are gain peaks corresponding to the transitions between higher energy levels.

Figure 28:
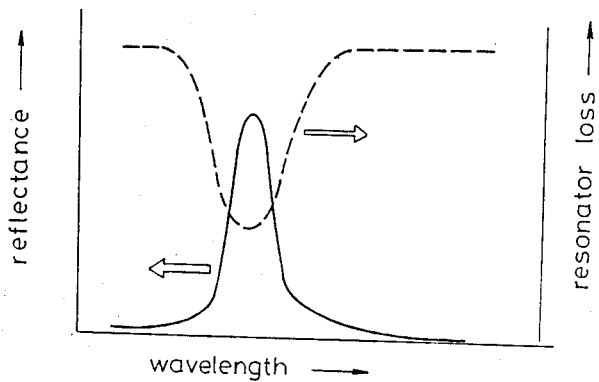
FIG. 28 is a diagram showing the wavelength vs reflectivity and the resonator loss characteristics of the sixth embodiment.

The reflection film 167 has a wavelength selectivity shown by real lines in FIG. 28, and this has a high reflectivity against the wavelength corresponding to n=2. When the reflectivity is made R and the resonator length is made L, the resonator loss is represented by a formula $(1/L)\cdot\ln(1/R)$, and it is represented by the dotted lines of FIG. 28. When a current is injected into the semiconductor laser of this embodiment having such a resonator loss, an oscillation occurs at the wavelength corresponding to n=2 because the gain and the loss are balanced thereat as shown in FIG. 27.

As described above, in this sixth embodiment, a coating of reflection film having a wavelength selectivity is formed on to the end surface of the resonator, an oscillation is suppressed at a low quantum level at which the resonator loss is large, and an oscillation at a high quantum level of short wavelength is obtained.

Figure 29:
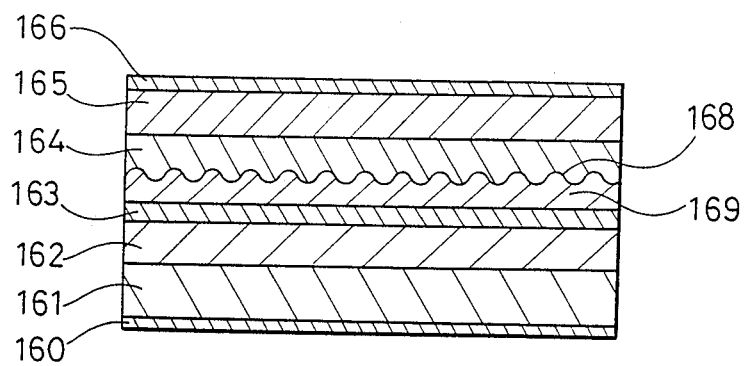
FIG. 29 is a diagram showing an alternative of the sixth embodiment.
Figure 30:
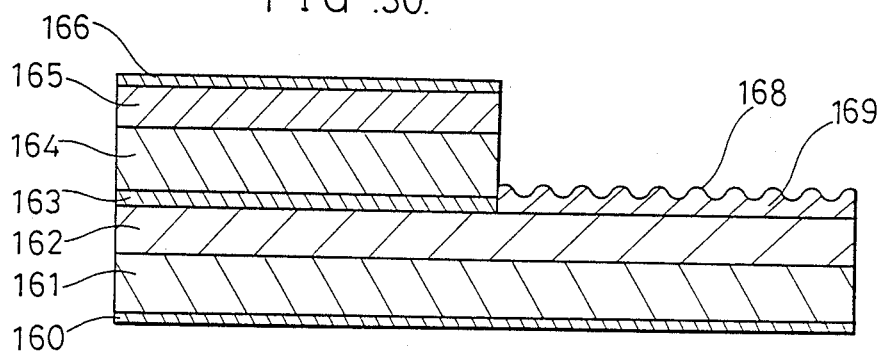
FIG. 30 is a diagram showing another alternative of the sixth embodiment.

In the above-illustrated embodiment a device including a resonator structure having wavelength selectivity utilizing a reflection film at the end surface is described, but a grating 168 may be used inside and outside the resonator as shown in the alternatives of FIGS. 29 and 30 with the same effects as the above-described embodiment.

Figure 31:
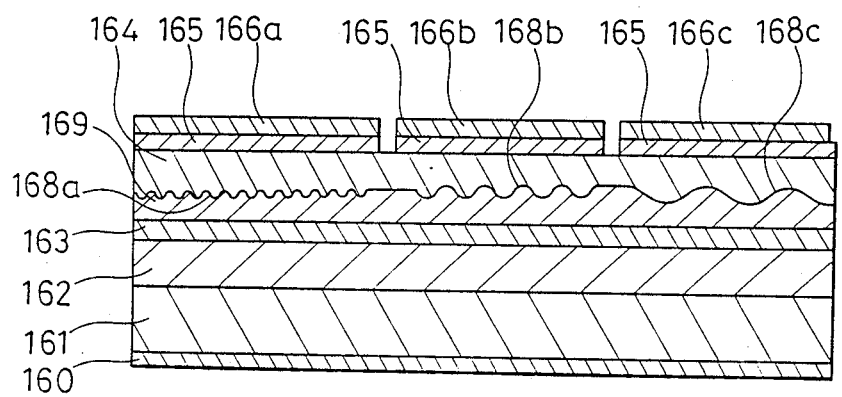
FIG. 31 is a diagram showing the other alternative of the sixth embodiment.

Furthermore, as shown in the alternative of FIG. 31, if a plurality of diffraction lattices 168A, 168B, and 168C having different periods corresponding to the respective quantum levels are arranged in the axis direction of the resonator and current injections are conducted independently to the respective portions from the electrodes 166A, 166B, and 166C, a plurality of light beams of different wavelengths which are different by several 100 Å can be output from the same laser and these can be switched. In FIGS. 29, 30 and 31 the reference numeral 169 designates a guide layer.

Figure 32:
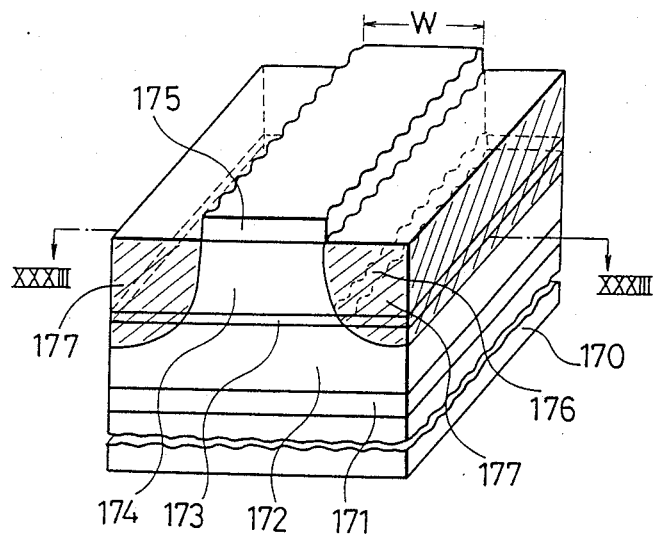
FIG. 32 is a diagram showing the structure of a semiconductor laser as a seventh embodiment of the present invention.

FIG. 32 shows a seventh embodiment of the present invention.

In FIG. 32, the reference character 170 designates an n type GaAs substrate, the numeral 171 designates an n type GaAs buffer layer, the reference numeral 172 designates an n type AlGaAs cladding layer, the reference numeral 173 designates an active layer, for example, GaAs active layer of about 100 Å thickness, the reference numeral 174 designates a p type AlGaAs cladding layer, the reference numeral 175 designates a p type GaAs contact layer, the reference numeral 177 designates a transverse direction confinement layer, and this transverse direction confinement layer 177 is produced by diffusion of an element such as silicon.

In this embodiment, a transverse direction confinement method using the disordering of the quantum well by the diffusion of impurities is used, and this production method is recited in Journal of Applied Physics vol. 58, No. 12, pp. 4515 to 4520 (1985).

Figure 33:
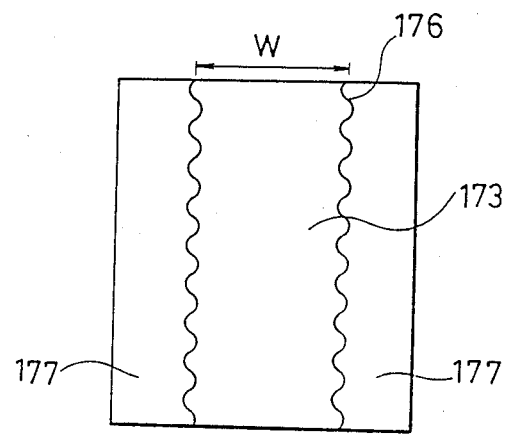
FIG. 33 is a diagram showing a cross-section in lines XXXIII to XXXIII of FIG. 32.

FIG. 33 shows a cross section in lines XXXIII—XXXIII of the portion of the active layer 11 of FIG. 32. The characteristics of this seventh embodiment reside in that the width of the active layer 173 shown in the figure is made less that 10 μm, desirably to be less than 6 μm, and in this case it is made 1.3 μm. In order to enhance the internal loss in this state, there is provided a non-periodic cancavo-convex 176 at the boundary between the active layer 173 and the transverse direction confinement layer 177 similarly as in the second embodiment. Herein, the resonator length is made above longer than 500 μm.

The device will be operated as follows.

In this seventh embodiment, the width W of the active layer 173 is made narrow as described above so as to increase the effects due to the internal loss. When the width of the active layer is made narrow the gain is reduced to that extent, and the $g_{th}$ is lowered as described in the first embodiment. Accordingly, when the internal loss is enhanced to some degree by the non-periodic concavo-convex 176 as described above, a gain for obtaining a laser oscillation cannot be obtained at the quantum level of n=1. Then, the laser oscillation occurs at levels of n equal to or larger than 2 where the state density is larger and the wavelength is shorter.

The non-periodic concavo-convex 176 of the present embodiment effectively increases the internal loss by making the width W of the active layer 173 less than 6 μm. For example, the oscillation wavelength obtained by a structure in which the concavo-convex is not provided at the active layer 173 and which has the same structure as that of this embodiment is 8500 Å while the oscillation wavelength of the above-described embodiment is 8000 Å.

The width of the active layer 173 is made less than 10 μm, preferably less than 6 μm in order to increase the internal loss effectively. If it is larger than that, the influence which is given to the active layer 173 by the internal loss which is generated by the scattering of the light at the concavo-convex of the boundary is not sufficient. On the other hand, the effects by the concavo-convex at the boundary are favorable in a case where the width of the active layer 173 is made less than 1.5 μm.

Furthermore, when the thickness of the active layer 173 is made less than 300 Å, the electrons and holes become likely to be distributed at the quantum levels, and it is possible to produce an oscillation at the level above n=2 more effectively.

Figure 34:
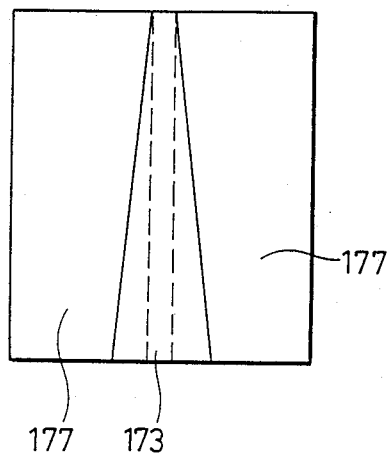
FIG. 34 is a diagram showing an alternative of the seventh embodiment.

In the above seventh embodiment a non-periodic concavo-convex 176 is produced at the boundary between the active layer 173 and the transverse direction confinement layer 177 in order to increase the internal loss, but it is possible to increase the internal loss by changing the width of the active layer 173 in the direction in which the light is guided as shown in FIG. 34. The width of the active layer 173 is, for example, about 1 micron at one end of the resonator and about 4 micron at the other end thereof. In this active layer 173 it is possible to reflect the light at a portion of the stripe of 1 micron at the center of the active layer 173 (the range between the two dotted lines in FIG. 34), but it is not possible to reflect the same at the region other than that, whereby the internal loss is increased.

Figure 35:
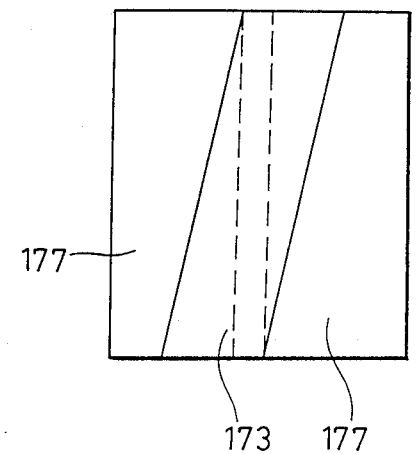
FIG. 35 is a diagram showing another alternative of the seventh embodiment.

Furthermore, as shown in FIG. 35, it is also possible to increase the internal loss similarly as in the above-described embodiment by constituting the laser in such a manner that the boundary between the active layer 173 and the transverse direction confinement layer 177 is not substantially vertical with the resonator end surface. The active layer 173 in this case is made to have a stripe width of about 1 μm capable of reflecting the light at the center and the width of the active layer 173 is made about 4 micron. Herein, the configuration of the active layer 173 is not restricted to that of the above-described embodiment, and the internal loss may be increased by constituting the active layer in other configurations. Furthermore, a light confinement layer may be provided between the cladding layer and the active layer.

Furthermore, in a case where the width of the active layer is less than 0.5 micron, the internal loss surely has a value of some degree, and the above-described phenomenon can be expected even in the prior art configuration.

Figure 36:
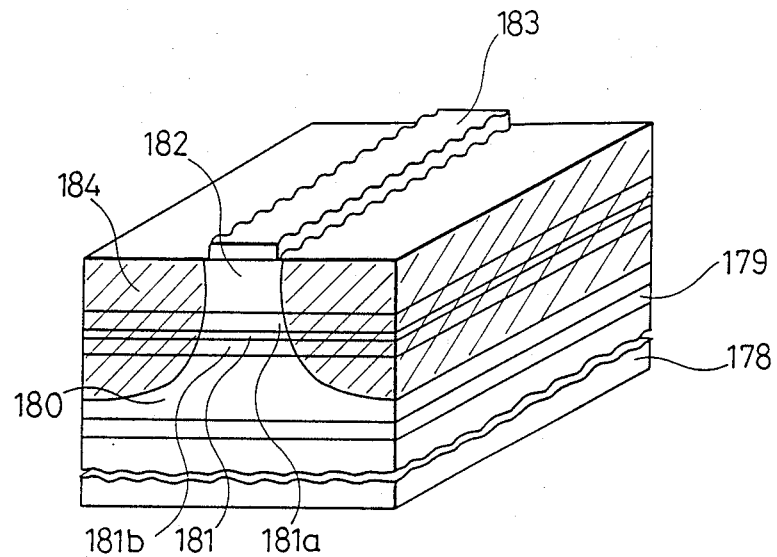
FIG. 36 is a diagram showing the structure of the semiconductor laser as an eighth embodiment of the present invention.

FIG. 36 shows an eighth embodiment of the present invention. In FIG. 36, the reference numeral 178 designates an n type GaAs substrate, the reference numeral 179 designates an n type GaAs buffer layer, the reference numeral 180 designates an n type AlGaAs cladding layer, the reference numeral 181 designates a GaAs or AlGaAs active layer having a thickness of about 100 Å. The reference numerals 181a and 181b designate lightguide layers, the reference numeral 182 designates a p type AlGaAs cladding layer, and the reference numeral 183 designates a p type GaAs contact layer.

Figures 37, 37A, 37C:
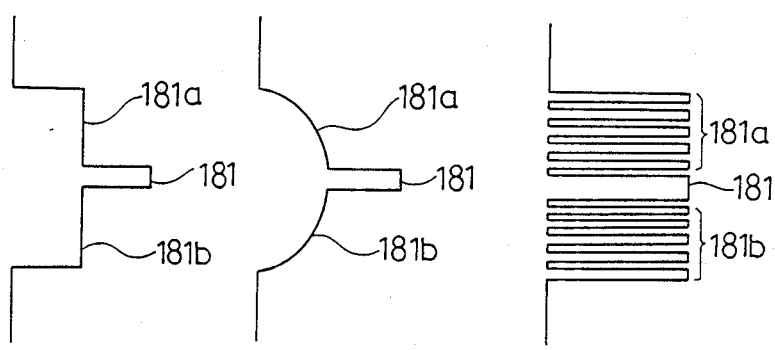
FIG. 37 is a diagram showing the structure of the lightguide layer as an eighth embodiment of the present invention.

Furthermore, the reference numeral 184 designates a region to which silicon is diffused. FIG. 37 shows an example of the energy band structure of the active layer 181 and the upper and lower lightguide layer 181a and 181b. FIG. 37(a) shows a case where the lightguide layer is in a one step configuration, and FIG. 37(b) shows a case where the lightguide layer is in a sloped type configuration. The lightguide layer is constituted by a semiconductor having an intermediate energy band gap between those of the semiconductors constituting the active layer and the cladding layer. Furthermore, as shown in FIG. 37(c), it is also possible to constitute a lightguide layer by selecting the semiconductor and the thicknesses of the quantum well layer and the barrier layer in the superlattice structure.

The device will be operated as follows.

In the semiconductor laser device of this embodiment, the effective refractive index is lowered relative to the region of the active layer 181 at a portion of the embedded layer 184 to which silicon is diffused, whereby a refractive index waveguide is obtained. Furthermore, at the above-described embedded layer 184 portion the potential barrier to which the carriers are sensitive becomes larger than that at the central stripe section by the mixture crystallization of the high Al mole fraction cladding layers 182 and 180, the lightguide layers 181a and 181b, and the active layer 181. Thus, a gain guiding waveguide is obtained.

Furthermore in the above-illustrated embodiment, the width of the stripe section of the active layer 181 is made less than 6 micron, and a concavo-convex is produced at the boundary between the stripe section 181 and the diffusion region 184 similarly as in the above-illustrated seventh embodiment. And thus, the internal loss by the light transmission (caused by scattering loss or the like) is made large. This internal loss is also increased by increasing the absorption loss by conducting a high concentration doping into the lightguide layer.

In this embodiment, by providing a SCH structure the optical confinement factor $\xi$ inside the quantum well active layer shown in the first embodiment is lowered thereby to effectively increase the $\alpha$, and thus phonon density is low and the induced emission is not likely to arise inside the quantum well, whereby a circumstance exists where the supplied carriers are likely to become hot. As a result a laser oscillation corresponding to the quantum level of $n=2$ or larger occurs.

FIG. 38(a) shows a ninth embodiment of the present invention. In FIG. 38(a) which shows a structure of a semiconductor laser of this ninth embodiment, the reference numeral 185 designates an n+ type GaAs substrate, the reference numeral 186 designates an n type $Al_zGa_{1-z}As$ cladding layer, the reference numeral 187 designates an n type $Al_zGa_{1-z}As$ parabola type refractive index distribution layer (z gradually changes to y), the reference numeral 188a designates a first $Al_xGa_{1-x}As$ active layer, the reference numeral 189 designates an $Al_yGa_{1-y}As$ barrier layer, the reference numeral 188b designates a second $Al_xGa_{1-x}As$ active layer, the reference numeral 190 designates a p type $Al_yGa_{1-y}As$ parabola type refractive index distribution layer (y gradually changes to z), the reference numeral 191 designates a p type $Al_zGa_{1-z}As$ cladding layer, and the reference numeral 192 designates a p+-GaAs contact layer.

Figure 38:
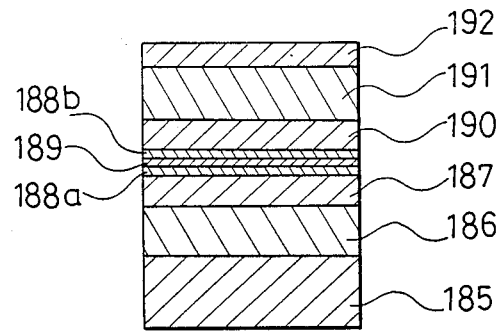
FIG. 38(a) is a diagram showing the structure of the semiconductor laser of a ninth embodiment of the present invention.
FIG. 38(b) is a diagram showing the energy band structure of the active layer portion of the ninth embodiment of the present invention.
Figure 38B:
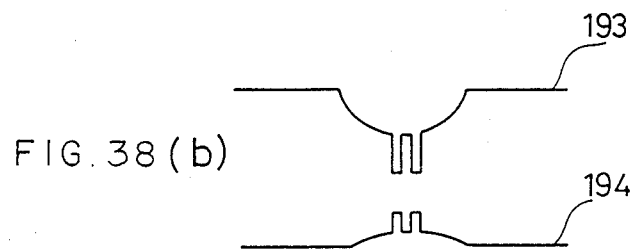

Furthermore, FIG. 38(b) shows an energy band structure of a semiconductor laser of the ninth embodiment shown of FIG. 38(a). This embodiment has a GRIN-SCH structure.

Figure 39:
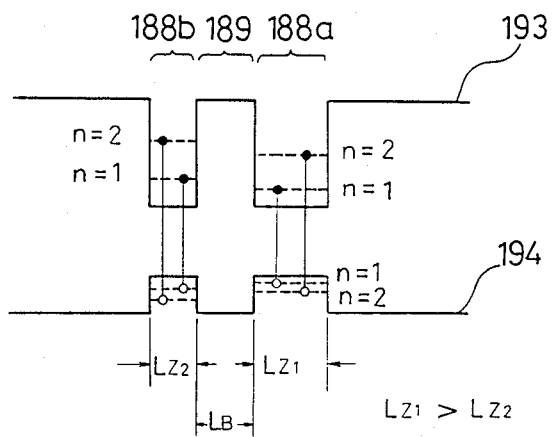
FIG. 39 is a diagram showing the energy band gap of the quantum well of the ninth embodiment of the present invention.

FIG. 39 shows a band structure in which double quantum well active layers 188a and 188b are arranged putting the barrier layer 189 therebetween. These active layers 188a and 188b have different thicknesses $L_{z1}$ and $L_{z2}$, respectively. Herein, the discrete energy levels become to have larger energies measured from the bottom of the conduction band as the $L_z$ becomes smaller as seen from the Schrodinger equation described in the description of the prior art device. Accordingly, when the values of $L_{z1}$ and $L_{z2}$ are designed well, an energy level of $n=1$ of the active layer 188b can be established between the energy levels of $n=1$ and $n=2$ of the active layer 188a ($L_{z1} > L_{z2}$).

The device will be operated as follows.

When carriers (electrons and holes) are injected into the semiconductor laser having the above-described active layer with said laser being in a forward biased direction, the combination of electrons and holes occur between the $n=1$ levels of the conduction band 193 and the valence band 194 of the active layer 188a, thereby occuring a light emission at a first wavelength. When carriers are further injected, combinations occur between the $n=1$ levels of the conduction band 193 and the valence band 194 of the active layer 188b, thereby producing a light emission of wavelength $\lambda_2$. Next, there arise combinations between the $n=2$ levels of the conduction band 193 and the valence band 194 of the active layer 188a, thereby producing a light emission at wavelength $\lambda_3$. In this way, when the injection current is increased, it becomes possible to obtain a laser oscillation at wavelengths $\lambda_1, \lambda_2, \lambda_3, \ldots$, gradually becoming shorter.

The method of producing the semiconductor device shown in FIG. 38 will be described.

At first, an n type $Al_zGa_{1-z}As$ cladding layer 186, an n type $Al_zGa_{1-z}As$ parabola type refractive index distribution layer (z gradually changes to y) 187, an $Al_x$-

$Ga_{1-x}As$ quantum well first active layer 188a, an $Al_yGa_{1-y}As$ barrier layer 189, an $Al_xGa_{1-x}As$ quantum well second active layer 188b, a p type $Al_yGa_{1-y}As$ parabola type refractive index distribution layer (y gradually changes to z) 190, a p type $Al_zGa_{1-z}As$ cladding layer 191, and a $p^+$-GaAs contact layer 192 are successively grown on an $n^+$ type GaAs substrate 185. Furthermore, an n type electrode is produced on the side of the $n^+$-GaAs substrate 185, a p type stripe electrode is produced on the side of the upper $p^+$-GaAs contact layer 192, and laser oscillator mirrors are produced vertically with the active layers 188a and 188b by such as cleavages. Thus, a quantum well type semiconductor laser having a plurality of quantum well active layers is produced.

In this ninth embodiment, the active layer is constituted by a plurality of quantum wells having different layer thicknesses, and a plurality of laser light beams which oscillate at different wavelengths with short wavelength differences are obtained which cannot be obtained by a single quantum well active layer. Furthermore, it is possible to switch the plurality of laser lights by a small injection current difference.

Figure 40:
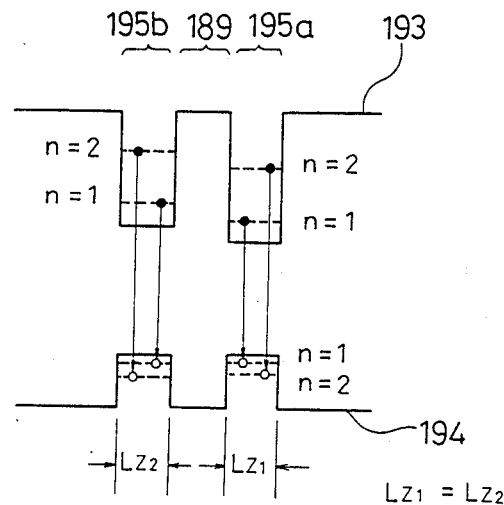
FIG. 40 is a diagram showing the quantum well energy band structure in the alternative of the ninth embodiment of the present invention.

Furthermore in the above-illustrated embodiment, the thicknesses of the quantum wells are varied so as to vary the energy levels of the quantum wells. But as shown in FIG. 40, the material composition can be changed without changing the thicknesses of the quantum wells ($L_{z1}=L_{z2}$) with the same effects as described above. In FIG. 40, the reference numeral 195a designates an $Al_{x1}Ga_{1-x1}As$ quantum well layer, and the numeral 195b designates an $Al_{x2}Ga_{1-x2}As$ quantum well layer, whereas $x2 > x1$.

Furthermore, differentiation of quantum well thicknesses and that of quantum well material compositions may be combined with each other.

Furthermore in the above-illustrated embodiment there are provided two quantum wells, but there may be provided more than three quantum wells.

Furthermore in the above-illustrated embodiment, a GRIN-SCH structure is used for the confinement of laser light, but other confinement methods can be used.

Furthermore in the above-illustrated embodiment, GaAs system material is used as material, but such as InP system material can be used with the same effects as described above.

FIG. 41 shows a structure of a tenth embodiment of the present invention. In FIG. 41, the reference numeral 196 designates an upper electrode, the reference numeral 197 designates a $p^+$ type GaAs contact layer, the reference numeral 198 designates a p type AlGaAs cladding layer, the reference numeral 199 designates a superlattice layer, the reference numeral 200 designates an undoped AlGaAs quantum well active layer, the reference numeral 201 designates an n type AlGaAs cladding layer, the reference numeral 202 designates an $n^+$-GaAs substrate, and the reference numeral 203 designates a lower electrode.

FIG. 42 shows an energy band structure showing the energy levels of the conduction band of the p type AlGaAs cladding layer 198, the superlattice layer 199, the quantum well active layer 200, and the n type AlGaAs cladding layer 201 of the semiconductor laser of FIG. 41. The vertical axis designates height of energy.

As shown in FIG. 42, the quantum well active layer 200 is assumed to have two quantum well levels of $n=1$ and $n=2$. At the side of the p type AlGaAs cladding layer 198 of this active layer 200 there is provided a periodic structure superlattice layer 199 comprising AlGaAs and AlAs or GaAs and AlAs, and the $n=1$ sub-band energy produced by this superlattice and the $n=1$ quantum level energy of the quantum well active layer are made equal to each other so as to arise a resonance tunneling effect therebetween.

The device will be operated as follows.

Generally, the electron occupation proportion of the quantum levels of $n=1$ and $n=2$ at the quantum well active layer having two quantum levels of $n=1$ and $n=2$ is determined by the level of injection current and the relaxation time in the quantum well. That is, the relaxation from $n=2$ to $n=1$ is superior to the electron injection into $n=2$ in the low current injection, and the gain of the wavelength corresponding to $n=1$ becomes large. Accordingly, the usual laser oscillation generally occurs at this wavelength. When the injection current is increased, the electrons injected from the cladding layer to the quantum well layer are increased, and the number of electrons held at $n=2$ level is increased than that of electrons relaxed from $n=2$ to $n=1$, and the gain of the wavelength corresponding to $n=2$ level is increased. Herein, when the resonator internal loss is extensively large, a laser oscillation at the $n=2$ level is observed.

Herein, in this embodiment electrons injected from the side of n type AlGaAs cladding layer 201 enter into the active layer 200, and these electrons are transported from the $n=1$ quantum level of the active layer to the $n=1$ quantum level of the superlattice layer 199 by the resonance tunneling effect, and they are taken out from the $n=2$ quantum level to the $n=1$ quantum level at the AlGaAs cladding layer.

Figure 43:
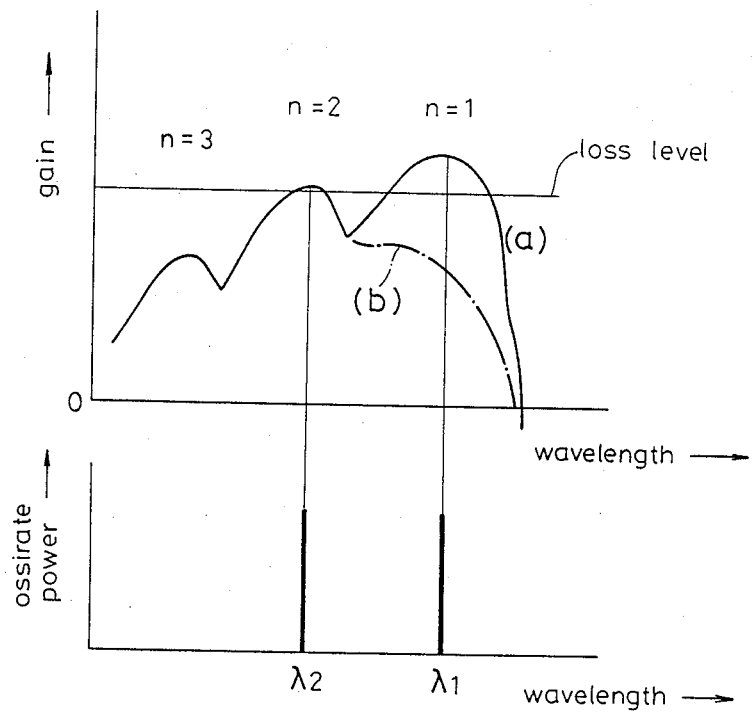
FIG. 43 is a diagram showing the relationship between the gain and the resonator loss for exemplifying the operation of the tenth embodiment.

As is understood from the wavelength characteristics of the gain at the injection current level shown in FIG. 43, it is possible to lower the gain at the $n=1$ quantum level as shown in FIG. 43(b) because electrons of $n=1$ quantum level of the quantum well active layer are effectively resonance tunneled to the side of the cladding layer 198 due to the fact that a superlattice is provided at the side of p type AlGaAs cladding layer 198, thereby reducing the number of electrons at the $n=1$ quantum level. Accordingly, when a superlattice layer 199 is not provided (refer to the curve(a) of FIG. 43), a laser oscillation at wavelength $\lambda_1$ correspondng to the $n=1$ level occurs. However, it is possible to conduct a laser oscillation at a wavelength $\lambda_2$ corresponding to the $n=2$ quantum level by providing a superlattice layer 199.

Accordingly, a laser oscillation at the $n=2$ level is enabled even when the internal loss is relatively small.

In this tenth embodiment, the gain at the $n=1$ quantum level can be lowered by the tunneling effect, and it is possible to conduct a laser oscillation corresponding to the $n=2$ quantum level at a relatively low threshold current even in a laser structure having a relatively low internal loss.

Figure 44:
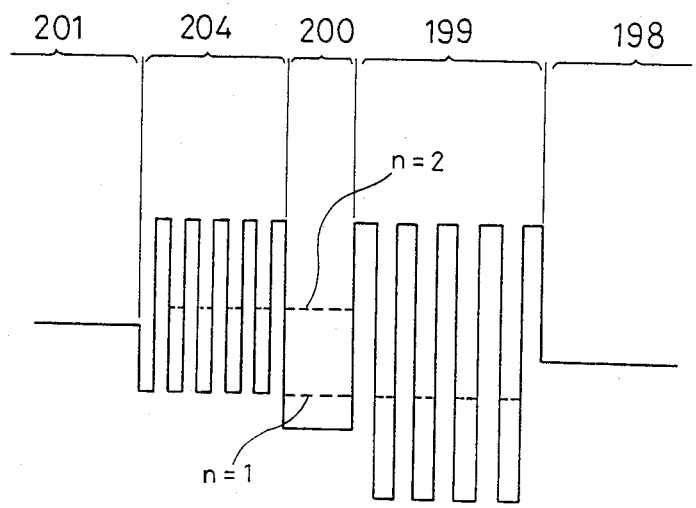
FIG. 44 is a diagram showing the energy band structure of an alternative of the tenth embodiment.

In the above-illustrated embodiment, electrons at the $n=1$ level are taken to the outside by the tunneling effect, but if a superlattice 204 comprising AlGaAs and AlAs layers or GaAs and AlAs layers at the side of the n type AlGaAs cladding layer 201 is provided and the quantum level of the superlattice and the $n=2$ quantum level of the active layer are adjusted to be equal to each other as shown in FIG. 44, the electrons from the cladding layer are effectively tunneling guided through this superlattice layer to the $n=2$ level, thereby resulting in laser oscillation corresponding to the $n=2$ quantum level at a further lower threshold value.

Furthermore, such a method can be also applied not only to a case where there are provided two quantum levels of n=1 and n=2 but also to a case where there are provided more than three quantum levels, resulting in a laser oscillation of n=3. Furthermore, a superlattice layer may have any structure if it has a quantum level which resonates with at least one of the quantum levels of quantum wells of the active layer.

Furthermore in the above-illustrated embodiment, conduction band electrons are utilized, but the valence band holes can be utilized similarly as above although the effect of lowering the wavelength is small due to the fact that the effective mass of positive hole is larger than that of electron.

Figure 45:
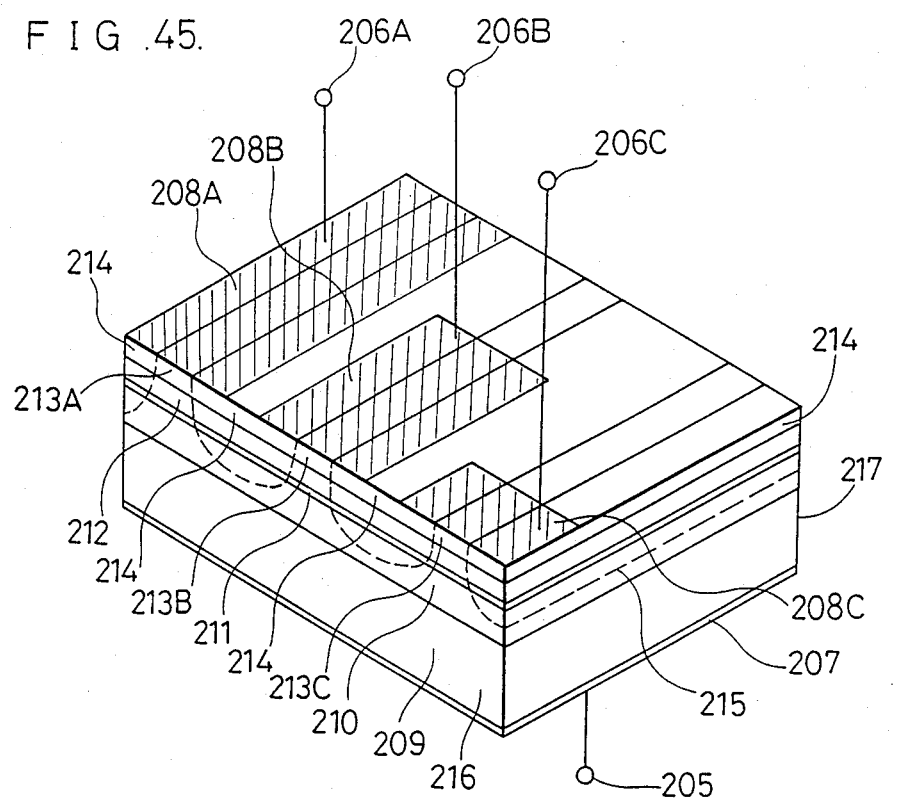
FIG. 45 is a diagram showing the structure of the semiconductor laser of an eleventh embodiment of the present invention.

FIG. 45 shows an eleventh embodiment of the present invention.

In FIG. 45 the reference numeral 205 designates a negative side current terminal, the reference numerals 206A, 206B, and 206C designate positive side current terminals, the reference numeral 207 designates an n electrode, the reference numerals 208A, 208B, and 208C designates p electrodes, the reference numeral 209 designates an n type GaAs substrate, the reference numeral 210 designates an n type AlGaAs cladding layer, the reference numeral 211 designates a multi-quantum well active layer, the reference numeral 212 designates a p type AlGaAs cladding layer, the reference numerals 213A, 212, and 213C designate a p type GaAs contact layer, the reference numeral 214 designates an insulating film, the reference numeral 215 designates a diffusion front of p type impurities, and the reference numerals 216 and 217 designate cleavage planes.

The cleavage planes 216 and 217 constitute a Fabry Perot resonator. The diffused p type dopants produce a stripe type waveguide in parallel with the axis of the resonator at the quantum well layer. The stripe width thereof is made narrow in order to increase the light absorption in the diffusion region at the neighbourhood of the waveguide by free carriers. The lengths $L_A$, $L_B$, $L_C$ of the electrodes 208A, 208B, and 208C in the length direction of the resonator become shorter in that order, and the length $L_A$ is the same as that of the resonator.

The device will be operated as follows.

Figure 46:
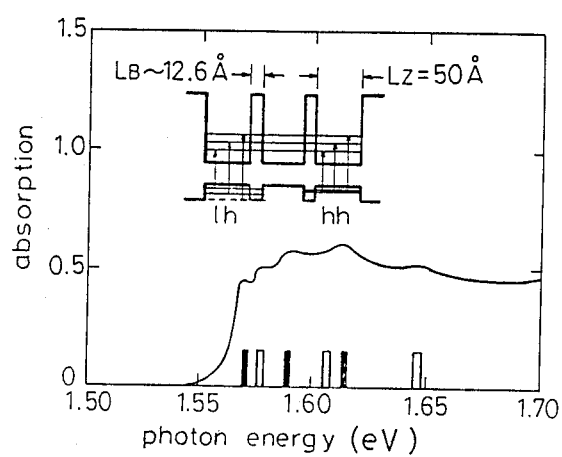
FIG. 46 is a diagram showing the absorption spectrum of the three quantum wells combined with each other.

The multi-quantum well of this embodiment has a narrow width barrier layer and the combination of electron states occur over the three quantum wells, and as a result the lowest quantum level of the multi-quantum well is divided into three as shown in FIG. 46. When the level which is concerned with the heavy holes (hh) is noted three absorption peaks are observed (To note the light emission concerning only the heavy holes corresponds to the TE mode). It is well known that the energy increases as the state density of the quantum levels become stepwisely higher, and thus the higher the energy quantum levels become as the amplification gain becomes higher when a band filling is produced by increasing the injection carrier density.

Next, it is considered that a current is injected only to the region of the length $L_B$ ($L_B < L_A$) of the semiconductor laser of the resonator length $L_A$. In the region to which a current injection is conducted, an amplification gain $g_B$ is obtained. When the waveguide loss caused by such as absorption and scattering is made $\alpha$ there arises a laser oscillation when the following condition is satisfied.

$$g_B > \frac{\alpha L_a + \ln \frac{1}{R}}{L_B} \quad (7)$$

Herein, the reference character R designates reflectivity of the cleavage planes 216 and 217. As apparent from formula (7) when the $L_B$ is decreased the right side of the inequality increases and there arises an oscillation only when $g_B$ is high. From this fact when the $L_B$ is gradually made smaller, oscillations according to the above-described three levels are obtained in the order from the longer wavelength. Accordingly, when the lengths $L_A$, $L_B$, and $L_C$ of the respective electrodes of the above-described embodiment shown in FIG. 45 are established at lengths in which oscillations corresponding to the respective levels are obtained, there arise laser oscillations of different wavelengths from the respective integrated semiconductor lasers which are integrated together.

As described above, in the eleventh embodiment, a plurality of semiconductor lasers of the same resonator length having a multiple quantum well layer having a barrier layer of such a thickness that the electron states are combined with each other as an active layer are provided on the same substrate and the lengths of the respective electrodes are varied to differentiate the resonator internal loss thereby to produce oscillations at the different quantum levels, whereby a semiconductor laser which is capable of oscillating at different wavelengths to be used for a wavelength multiplexed communication is obtained. Furthermore, this semiconductor laser can be produced by onetime epitaxial growth with no necessity of producing a grating, thereby resulting in a low cost.

Figure 47:
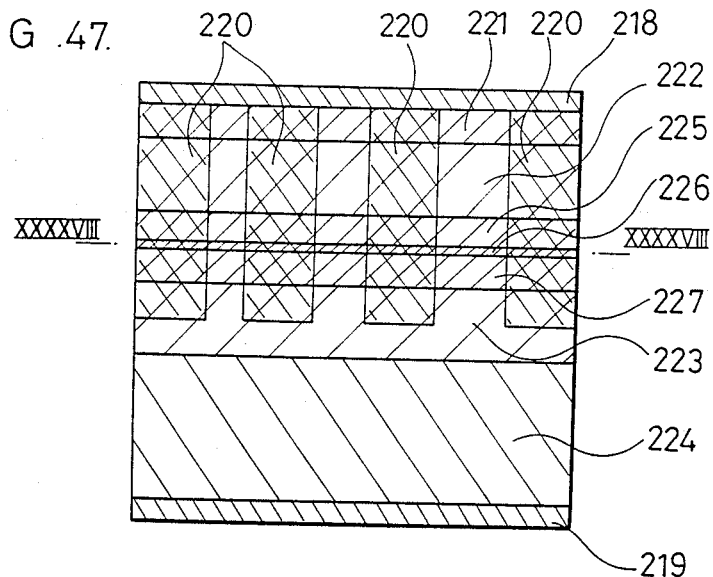
FIG. 47 is a diagram showing the structure of the semiconductor laser of the twelveth embodiment of the present invention.

FIG. 47 shows a twelfth embodiment of the present invention. In FIG. 47, the reference numeral 218 designates an upper electrode, the reference numeral 219 designates a lower electrode, the reference numeral 220 designates a Zn diffusion region, the reference numeral 221 designates a p type GaAs contact layer, the reference numeral 222 designates a p type AlGaAs cladding layer, the reference numeral 223 designates an n type AlGaAs cladding layer, the reference numeral 224 designates an n type GaAs substrate, the reference numeral 225 designates a p type $Al_{0.3}Ga_{0.7}As$ optical confinement layer, the reference numeral 226 designates a GaAs active layer of 100 Å thickness, and the reference numeral 227 designates an n type $Al_{0.3}Ga_{0.7}As$ confinement layer.

Figure 48:
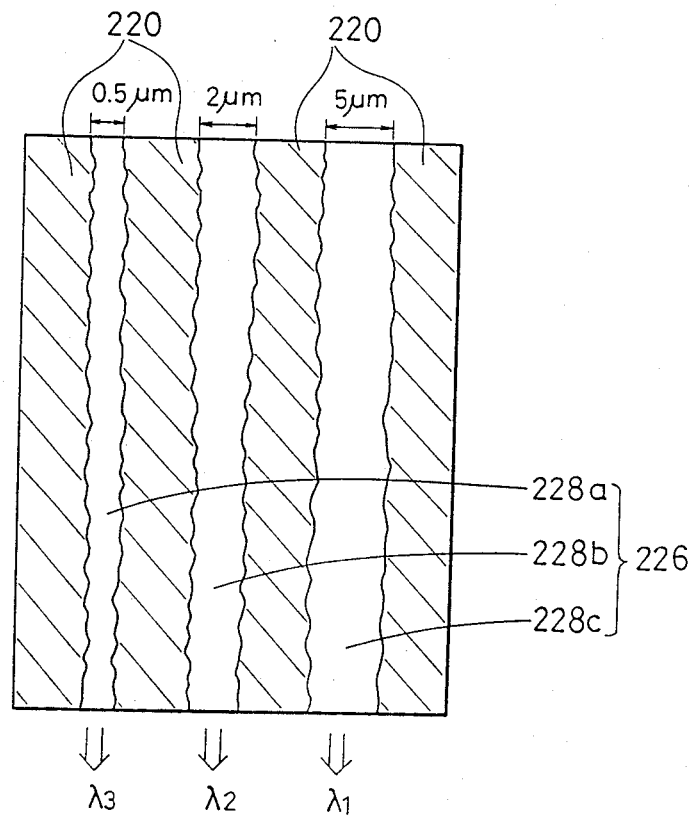
FIG. 48 is a diagram showing the cross-section in lines XXXXVIII to XXXXVIII of FIG. 47.

FIG. 48 shows a cross section in lines XXXVIII to XXXVIII at the center of the active layer 226 of FIG. 47. The average stripe widths of the active layers are 0.5 $\mu$m, 2 $\mu$m, 5 $\mu$m, respectively, and the stripe edge is made to have somewhat concavo-convex.

The production of this laser can be conducted in accordance with the method recited in such as Applied Physics Letters vol. 44, p. 700, (1984).

The device will be operated as follows.

When the active layer is of a quantum well structure, the carriers injected into the active layer have quantized energy levels, and recombinations of electrons and holes occur to generate light emissions between discrete energy levels of n=1, n=2, . . . . The laser oscillation occurs when the current gain in the light waveguide becomes larger than the resonator loss. In a case having a quantum level active layer, by injecting a current the gain is increased with the wavelength corresponding to the quantum level n=1 as a peak and when the gain $g_1$ at this wavelength becomes larger than the resonator loss, there arises an oscillation at the wavelength $\lambda_1$ corresponding to the quantum level of n=1. On the other hand, when the resonator loss is quite high there arises no oscillation at the gain of n=1, and when the injected current is further increased, the gain at the wavelength $\lambda_2$ corresponding to the quantum level of n=2 is increased, and when the gain $g_2$ of n=2 is increased to a value larger than the gain $g_1$ at n=1 at an injection current larger than a predetermined value and becomes larger than the resonator loss, a laser oscillation occurs at the wavelength $\lambda_2$ corresponding to the quantum level of n=2 ($\lambda_2 < \lambda_1$). Herein, the fact that the state density of carriers at the quantum level of n=2 is larger than that at the quantum level n=1 and the band filling are related to that the gain $g_2$ is larger than the gain $g_1$.

In the semiconductor laser array of this twelfth embodiment, the resonator internal losses are varied by changing the stripe widths of the light waveguides 228a, 228b, 228c of the quantum well active layer 20 as 0.5 μm, 2 μm, 5 μm, respectively, as shown in FIGS. 47 and 48. That is, the narrower the stripe width is the larger the effect of scattering in the stripe edge and the higher the resonator internal loss becomes, and therefore the relationship between the internal losses $\alpha_{228a}$, $\alpha_{228b}$, and $\alpha_{228c}$ at the light waveguides 228a, 228b, and 228c becomes as in the following $$\alpha_{228a} > \alpha_{228b} > \alpha_{228c}.$$

When a current is injected into the semiconductor laser array of this twelfth embodiment, at first the gain at the wavelength corresponding to the quantum level n=1 which is the lowest quantum level becomes larger than the loss $\alpha_{228c}$ at the light waveguide 228c of a low resonator loss, and an oscillation occurs at the wavelength $\lambda_1$ corresponding to the quantum level n=1. Next, at the light waveguide 228b having an intermediate resonator loss there arises no oscillation at n=1, and a laser oscillation at the wavelength $\lambda_2$ ($<\lambda_1$) corresponding to the quantum level n=2 arises when the gain at the wavelength corresponding to the quantum level n=2 becomes larger than the loss $\alpha_{228b}$. Finally, in the light waveguide 228a having a high resonator loss, oscillations at n=1 and n=2 do not arise because the gains thereof do not become larger than the loss $\alpha_{228a}$, and furthermore when the gain at the wavelength corresponding to the quantum level n=3 is increased to a value larger than the loss $\alpha_{228a}$, a laser oscillation at the wavelength $\lambda_3$ corresponding to n=3 ($\lambda_3 < \lambda_2 < \lambda_1$) occurs.

In this method, the stripe width is changed in order to vary the resonator internal loss, but other methods of varying the resonator internal loss, such as, the method of varying the amount of absorption at the portion for absorbing the light at the both sides of the active layer may be used. Furthermore, the mirror loss of the respective laser may be varied by varying the reflectivity of the mirror of the respective laser by such as a method of end facet coating.

Furthermore, the methods of using diffusions of silicon and Zn recited in Journal of Applied Physics 58. 4515 (1985) may be used with the resulted effect of lowering the threshold current of the laser.

Furthermore, as the transverse direction confinement method a general method of transverse direction confinement such as an embedded heterostructure method cam be used.

Furthermore, the active layer may be of a multiple quantum well structure.

Furthermore, the light confinement layer in the thickness direction of SCH structure may not be necessarily provided.

In the descriptions of the first, second, third, fourth, fifth, sixth, and eleventh embodiments among the above described twelve embodiments, the layer thickness of the quantum well active layer and the stripe width of the light waveguide of the semiconductor laser are not described in detail. However, these layer thicknesses are desirable to be less than 300 Å and the stripe width less than 10 micron so as to increase the loss of the light transmission and to enhance the occupation proportion of the higher quantum levels by making the injected carriers difficult to be subjected to energy relaxation.

Furthermore, as a method of producing such a narrow stripe a method recited in the Journal of Applied Physics vol. 58, p. 4515 (1985) can be used in order to accomplish the lowering of the threshold value as described in the seventh embodiment. However, the method of producing a narrow stripe is not limited that method, and any method capable of obtaining a narrow stripe width active layer can be used. That is, as the transverse direction confinement, a ridge waveguide, a buried heterostructure, a channeled planar substrate, or a general superlattice disordering by impurity diffusion can be used.

Furthermore, the active layer may be made of a single quantum well structure or a multiple quantum well structure in devices other than the embodiments in which they are particularly specified.

In the illustrated embodiment a laser using GaAs/AlGaAs is described, but InP/InGaAsP can be also used with the same effects as described above.

As is evident from the foregoing description, according to the present invention, the resonator internal loss or mirror loss is enhanced to some degree thereby to control the balance between the gain and the loss, whereby laser oscillation at a higher quantum level is made possible. This enables conducting an oscillation at a short wavelength, switching the oscillation wavelength by a switching of injection current, and conducting oscillations of more than two wavelengths at the same time by an injection of a predetermined current. Such a semiconductor laser is also obtained at a low cost. When such a semiconductor laser utilizing the principle of the present invention is applied to an integrated semiconductor laser, an integrated semiconductor laser for wavelength multiple light communication oscillating at different wavelengths is easily obtained at a low cost, and the utilization efficiency thereof is quite evident.

What is claimed is:

1. In a semiconductor laser having an active layer of a quantum well structure, the improvement comprising:
 a light absorption region provided at the outside of a light waveguide path of said active layer, the resonator internal loss being increased by said light absorption region, the oscillation wavelength being controlled by the relationship between said resonator internal loss and the gain produced by an injection current to vary said wavelength by varying said injection current to produce oscillation at different quantum levels.

2. In a semiconductor laser as defined in claim 1, wherein said light absorption region is formed by proton irradiation.

3. In a semiconductor laser as defined in claim 1, wherein said external light absorption region is formed by diffusion in a portion of said light waveguide path to increase the carrier density thereof to be higher than that of the remaining region of said light waveguide path of said active layer.

4. In a semiconductor laser as defined in claim 1, wherein said active layer is of a multiple quantum well layer.

5. In a semiconductor laser as defined in claim 1, wherein said semiconductor laser has cladding layers having composition proportions varying in a thickness direction.

6. In a semiconductor laser as defined in claim 1, wherein said semiconductor laser conducts light confinement in the transverse direction by impurity diffusion.

7. In a semiconductor laser as defined in claim 1, wherein said semiconductor laser conducts light confinement in the transverse direction by a ridge waveguide structure.

8. In a semiconductor laser as defined in claim 1, wherein said semiconductor laser conducts light confinement in the transverse direction by a buried heterostructure.

9. In a semiconductor laser as defined in claim 1, wherein said semiconductor laser conducts light confinement in the transverse direction by CSP.

10. In a semiconductor laser as defined in claim 1, wherein said active layer is constituted by providing a plurality of quantum wells having different quantum energy levels in close to each other.

11. In a semiconductor laser as defined in claim 10, wherein said plurality of quantum wells having different quamtum energy levels comprise same composition material and have different thicknesses.

12. In a semiconductor laser as defined in claim 10, wherein said plurality of quantum wells having different quantum energy levels has the same thicknesses and different composition material.

13. In a semiconductor laser as defined in claim 10, wherein said plurality of quantum wells having different quantum energy levels have different thicknesses and different composition material.

14. In a semiconductor laser as defined in claim 10, wherein oscillations of a plurality of wavelengths corresponding to the respective quantum energy levels of the plurality of quantum wells are conducted by changing the injection current into said active layer.

15. A quantum well semiconductor laser as defined in claim 1, including first and second conductivity type cladding layers provided on either side of said active layer; and first and second electrodes sandwiching said cladding and active layers, the width of said active layer being less than 10 micron, and the laser having a large internal loss.

16. A semiconductor laser as defined in claim 1, wherein said active layer is provided in a separate confinement hererostructure (SCH) including a light guide layer having an energy gap intermediate the energy gaps of said cladding and active layers, the width of said light guide layer being less than 6 micron to further increase the internal loss of said laser.

17. In a semiconductor laser having an active layer of a quantum well structure, the improvement comprising:

a superlattice layer having an energy level which is equal to at least one of a plurality of quantum levels of the quantum well structure, and transitions of electrons occur between the superlattice layer and the quantum well active layer by a resonance tunneling effect.

18. In a semiconductor laser as defined in claim 17, wherein a laser oscillation at a higher quantum level ($n \geq 2$) is enabled with suppressing of the laser oscillation at the lowest quantum level with the electrons at the lowest quantum level of said quantum well active layer being taken out from said active layer to said superlattice layer by a resonance tunneling effect.

19. In an integrated semiconductor laser including a plurality of semiconductor lasers having the same resonator length on the same substrate, the improvement comprising:

respective lasers having an active layer of a quantum well structure having a narrow width barrier layer such that the electron states of adjacent quantum wells are combined with each other and with carrier injection regions of different sizes.

20. In a semiconductor laser array as defined in claim 19, wherein said active layer is of a single quantum well structure.

21. In a semiconductor laser array as defined in claim 20, wherein said active layer is of a multiple quantum well structure.

22. In a semiconductor laser array as defined in claim 21, wherein said quantum well structures have different quantum well thicknesses and different material compositions.

23. In a semiconductor laser array as defined in claim 21, wherein said quantum well structures have different thicknesses and different material compositions of said barrier layers.

24. In a semiconductor laser array including a plurality of semiconductor lasers having quantum well structure active layers arranged in a transverse direction on a substrate, wherein the resonator internal loss of said semiconductor lasers are different from each other.

25. In a semiconductor laser array as defined in claim 24, wherein the resonator internal losses of said semiconductor lasers are differentiated by varying the stripe widths of respective light waveguide paths.

26. In a semiconductor laser array as defined in claim 24, wherein said active layer is of a single quantum well structure.

27. In a semiconductor laser array as defined in claim 24, wherein said active layer is of a multiple quantum well structure.

28. In a semiconductor laser array as defined in claim 27, wherein said quantum well structures have different quantum well thicknesses and different material compositions.

29. In a semiconductor laser array as defined in claim 27, wherein said quantum well structures have different thicknesses and different material compositions of said barrier layers.

30. In a semiconductor laser array including a plurality of semiconductor lasers each having a quantum well structure active layer arranged in a transverse direction, wherein mirror losses due to the end surface reflectivity of said semiconductor lasers are different from each other.

31. In a semiconductor laser array as defined in claim 30, wherein said active layer is of a single quantum well structure.

32. In a semiconductor laser array as defined in claim 30, wherein said active layer is of a multiple quantum well structure.

33. In a semiconductor laser array as defined in claim 32, wherein said quantum well structures have different quantum well thicknesses and different material compositions.

34. In a semiconductor laser array as defined in claim 32, wherein said quantum well structures have different thicknesses and different material compositions of said barrier layers.

35. In a semiconductor laser having an active layer of a quantum well structure, the improvement comprising:
means for increasing the resonator loss of said laser to produce oscillation at a quantum level higher than $n=1$, where n defines the quantum energy levels of the active layer.

36. In a semiconductor laser as recited in claim 35, wherein said means for increasing resonator loss comprises means for absorbing a predetermined amount of light from a light waveguide of said laser.

37. In a semiconductor laser as recited in claim 36, wherein said means for absorbing comprises a region at a portion of the resonator in which no current is injected.

38. In a semiconductor laser as recited in claim 37, wherein said region is formed by providing an electrodeless region of said resonator.

39. In a semiconductor laser as recited in claim 37, wherein said region is formed by proton irradiation of said portion of the resonator to increase the resistance of said resonator at said portion.

40. A quantum well semiconductor laser as defined in claim 35, including first and second conductivity type cladding layers provided on either side of said active layer; and first and second electrodes sandwiching said cladding and active layers, the width of said active layer being less than 10 micron, and the laser having a large internal loss.

41. A semiconductor laser as defined in claim 40, wherein said active layer is provided in a separate confinement heterostructure (SCH) including a light guide layer having an energy gap intermediate the energy gaps of said cladding and active layers, the width of said light guide layer being less than 6 micron to further increase the internal loss of said laser.

42. A semiconductor as defind in claim 41, wherein said lightguide layer has an energy band gap of an inclined type or stepwise type, and the structure of that portion is in a superlattice structure comprising a quantum well layer and a barrier layer having an energy band gap larger than that of the quantum well layer.

43. A semiconductor laser as defined in claim 42, wherein said superlattice structure of said lightguide layer has a constant thickness of said barrier layer, the thinner the thickness of said quantum well layer becomes in a direction away from said active layer.

44. In a semiconductor laser as defined in claim 35, wherein said active layer is of a single quantum well layer.

45. In a semiconductor laser as defined in claim 35, wherein said active layer is of a multiple quantum well layer.

46. In a semiconductor laser as defined in claim 35, wherein said semiconductor laser has cladding layers having composition proportions varying in a thickness direction.

47. In a semiconductor laser as defined in claim 35, wherein said semiconductor laser conducts a light confinement in the transverse direction by impurity diffusion.

48. In a semiconductor laser as defined in claim 35, wherein said semiconductor laser conducts light confinement in the transverse direction by a ridge waveguide structure.

49. In a semiconductor laser as defined in claim 35, wherein said semiconductor laser conducts light confinement in the transverse direction by a buried heterostructure.

50. In a semiconductor laser as defined in claim 35, wherein said semiconductor laser conducts a light confinement in the transverse direction by CSP.

51. A semiconductor laser as defined in claim 41, wherein said lightguide layer has an intermediate energy band gap between said cladding layer and said quantum well active layer, said energy band gap increasing continuously stepwisely away from said active layer in a direction vertical to said layer.

52. A semiconductor laser as defined in claim 41, wherein the absorption loss of said lightguide layer due to carriers is increased by doping donors or acceptors at a high concentration.

53. In a semiconductor laser as defined in claim 35, wherein said active layer is constituted by providing a plurality of quantum wells having different quantum energy levels in close to each other.

54. In a semiconductor laser having an active layer of a quantum well structure, the improvement comprising:
means for increasing the internal resonator loss to produce oscillations at wavelengths corresponding to at least two quantum levels.

55. A quantum well semiconductor laser as defined in claim 54, including first and second conductivity type cladding layers provided on either side of said active layer; and first and second electrodes sandwiching said cladding and active layers, the width of said active layer being less than 10 micron, and the laser having a large internal loss.

56. A semiconductor laser as defined in claim 54, wherein said active layer is provided in a separate confinement heterostructure (SCH) including a light guide layer having an energy gap intermediate the energy gaps of said cladding and active layers, the width of said light guide layer being less than 6 micron to further increase the internal loss of said laser.

57. In a semiconductor laser as defined in claim 54, wherein said active layer is of a single quantum well layer.

58. In a semiconductor laser as defined in claim 54, wherein said active layer is of a multiple quantum well layer.

59. In a semiconductor laser as defined in claim 54, wherein said semiconductor laser has cladding layers having composition proportions varying in a thickness direction.

60. In a semiconductor laser as defined in claim 54, wherein said semiconductor laser conducts light confinement in the transverse direction by impurity diffusion.

61. In a semiconductor laser as defined in claim 54, wherein said semiconductor laser conducts light confinement in the transverse direction by a ridge waveguide structure.

62. In a semiconductor laser as defined in claim 54, wherein said semiconductor laser conducts light confinement in the transverse direction by a buried heterostructure.

63. In a semiconductor laser as defined in claim 54, wherein said semiconductor laser conducts a light confinement in the transverse direction by CSP.

64. A quantum well semiconductor laser as defined in claim 55, wherein the width of said active layer is less than 6 micron, and the structure has a large internal loss.

65. A quantum well semiconductor laser as defined in claim 55, wherein there is provided an optical confinement layer between said cladding layer and said active layer.

66. A quantum well semiconductor laser as defined in claim 55, wherein non-periodic concavo-convex boundary is produced between said active layer and said transverse direction confinement layer, thereby increasing the internal loss.

67. A quantum well semiconductor laser as defined in claim 55, wherein the width of said active layer is varied in the direction of waveguiding the light, thereby increasing the internal loss.

68. A quantum well semiconductor laser as defined in claim 55, wherein the boundary between said active and said transverse direction confinement layer is made substantially non-vertical with the resonator end facet, thereby increasing the internal loss.

69. A quantum well semiconductor laser as defined in claim 55, wherein the width of said active layer is less than 1.5 μm, thereby increasing the internal loss.

70. A quantum well semiconductor laser as defined in claim 55, wherein said active layer is of a multiple quantum well layer.

71. A quantum well semiconductor laser as defined in claim 55, wherein said active layer is of a single quantum well layer.

72. A quantum well semiconductor laser as defined in claim 55, wherein the thickness of said active layer is less than 300 Å.

73. In a semiconductor laser as defined in claim 54, wherein said active layer is constituted by providing a plurality of quantum wells having different quantum energy levels in close to each other.

74. In a semiconductor laser having an active layer of a quantum well structure, the improvement comprising:
  means for increasing the internal resonator loss to a predetermined value; and
  means for supplying an injection current of a predetermined value;
  wherein oscillations are produced with wavelengths corresponding to at least two quantum levels at the same time.

75. A quantum well semiconductor laser as defined in claim 74, including first and second conductivity type cladding layers provided on either side of said active layer; and first and second electrodes sandwiching said cladding and active layers, the width of said active layer being less than 10 micron, and the laser having a large internal loss.

76. A semiconductor laser as defined in claim 74, wherein said active layer is provided in a separate confinement heterostructure (SCH) including a light guide layer having an energy gap intermediate the energy gaps of said cladding and active layers, the width of said light guide layer being less than 6 micron to further increase the internal loss of said laser.

77. In a semiconductor laser as defined in claim 74, wherein said active layer is of a multiple quantum well structure.

78. In a semiconductor laser as defined in claim 74, wherein said active layer is of a single quantum well structure.

79. A semiconductor laser as defined in claim 74, wherein said semiconductor laser has cladding layers having composition proportions varying in a thickness direction.

80. In a semiconductor laser as defined in claim 74, wherein said semiconductor laser conducts light confinement in the transverse direction by impurity diffusion.

81. In a semiconductor laser as defined in claim 74, wherein said semiconductor laser conducts light confinement in the transverse direction by a ridge waveguide structure.

82. In a semiconductor laser as defined in claim 74, wherein said semiconductor laser conducts light confinement in the transverse direction by a buried heterostructure.

83. In a semiconductor laser as defined in claim 74, wherein said semiconductor laser conducts light confinement in the transverse direction by CSP.

84. In a semiconductor laser as defined in claim 74, wherein said active layer is constituted by providing a plurality of quantum wells having different quantum energy levels in close to each other.

85. In a semiconductor laser having an active layer of a quantum well structure, the improvement comprising:
  means for changing the internal resonator loss in response to an external signal, wherein oscillations are enabled at a plurality of quantum levels.

86. A quantum well semiconductor laser as defined in claim 85, including first and second conductivity type cladding layers provided on either side of said active layer; and first and second electrodes sandwiching said cladding and active layers, the width of said active layer being less than 10 micron, and the laser having a large internal loss.

87. A semiconductor laser as defined in claim 85, wherein said active layer is provided in a separate confinement heterostructure (SCH) including a light guide layer having an energy gap intermediate the energy gaps of said cladding and active layers, the width of said light guide layer being less than 6 micron to further increase the internal loss of said laser.

88. In a semiconductor laser as defined in claim 85, wherein said mens for changing the internal resonator loss shifts the wavelength of the exciton absorption spectrum by applying a reverse bias to a portion of the active layer structure in which a current is injected at another portion thereof.

89. In a semiconductor laser as defined in claim 85, wherein said active layer is of a multiple quantum well structure.

90. In a semiconductor laser as defined in claim 85, wherein said active layer is of a single quantum well structure.

91. In a semiconductor laser as defined in claim 85, wherein said semiconductor laser has cladding layers having composition proportions varying in a thickness direction.

92. In a semiconductor laser as defined in claim 85, wherein said semiconductor laser conducts light confinement in the transverse direction by impurity diffusion.

93. In a semiconductor laser as defined in claim 85, wherein said semiconductor laser conducts light confinement in the transverse direction by a ridge waveguide structure.

94. In a semiconductor laser as defined in claim 85, wherein said semiconductor laser conducts light confinement in the transverse direction by a buried heterostructure.

95. In a semiconductor laser as defined in claim 85, wherein said semiconductor laser conducts light confinement in the transverse direction by CSP.

96. In a semiconductor laser as defined in claim 85, wherein said active layer is constituted by providing a plurality of quantum wells having different quantum energy levels in close to each other.

97. In a semiconductor laser having an active layer of a quantum well structure, the improvement comprising:
  a plurality of current injection electrodes; and
  means for inducing oscillation at a plurality of quantum levels by controlling the injection current supplied independently to each of said plurality of electrodes.

98. In a semiconductor laser as defined in claim 97 wherein one of said plurality of electrodes is used to supply a current for laser oscillation and another of said plurality of electrodes is used to supply a current to an absorption region which is provided inside a resonator of said laser.

99. In a semiconductor laser having an active layer of a quantum well structure, the improvement comprising:
  a resonator including a reflection film having wavelength selectivity such that only a wavelength corresponding to a quantum level higher than the lowest quantum level is reflected by said reflection film to produce oscillation at said higher quantum level.

100. A quantum well semiconductor laser as defined in claim 99, including first and second conductivity type cladding layers provided on either side of said active layer; and first and second electrodes sandwiching said cladding and active layers, the width of said active layer being less than 10 micron, and the laser having a large internal loss.

101. A semiconductor laser as defined in claim 99, wherein said active layer is provided in a separate confinement heterostructure (SCH) including a light guide layer having an energy gap intermediate the energy gaps of said cladding and active layers, the width of said light guide layer being less than 6 micron to further increase the internal loss of said laser.

102. In a semiconductor laser as defined in claim 99 wherein said resonator has a coating of reflection film which has a low reflectivity against light of a wavelength corresponding to the lowest quantum level and has a high reflectivity against light of a wavelength corresponding to said higher quantum level, which coating is provided to least one end facet of said laser.

103. In a semiconductor laser as defined in claim 99, wherein said reflection film is formed by a grating for reflecting light of a wavelength corresponding to said higher quantum level, which grating is provided at the inside or outside of the resonator.

104. In a semiconductor laser as defined in claim 103, wherein there are provided a plurality of gratings having different periods inside said resonator, current injections being conducted independently to said plurality of gratings, at least one of said plurality of gratings selectively reflecting light of said wavelength corresponding to a higher quantum level.

105. In a semiconductor laser as defined in claim 99, wherein said active layer is of a multiple quantum well structure.

106. In a semiconductor laser as defined in claim 99, wherein said active layer is of a single quantum well structure.

107. In a semiconductor laser as defined in claim 99, wherein said semiconductor laser has cladding layers having composition proportions varying in a thickness direction.

108. In a semiconductor laser as defined in claim 99, wherein said semiconductor laser conducts light confinement in the transverse direction by impurity diffusion.

109. In a semiconductor laser as defined in claim 99, wherein said semiconductor laser conducts light confinement in the transverse direction by a ridge waveguide structure.

110. In a semiconductor laser as defined in claim 99, wherein said semiconductor laser conducts light confinement in the transverse direction by a buried heterostructure.

111. In a semiconductor laser as defined in claim 99, wherein said semiconductor laser conducts light confinement in the transverse direction by CSP.

112. In a semiconductor laser as defined in claim 99, wherein said active layer is constituted by providing a plurality of quantum wells having different quantum energy levels in close to each other.

113. In a semiconductor laser as defined in claim 1, wherein said active layer is of a single quantum well layer.

* * * * *